(12) United States Patent
Lim et al.

(10) Patent No.: US 12,324,256 B2
(45) Date of Patent: Jun. 3, 2025

(54) IMAGE SENSOR

(71) Applicant: SAMSUNG ELECTRONICS CO., LTD., Suwon-si (KR)

(72) Inventors: Jung Wook Lim, Suwon-si (KR); Joong Seok Park, Suwon-si (KR); Dong Suk Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 55 days.

(21) Appl. No.: 18/104,877

(22) Filed: Feb. 2, 2023

(65) Prior Publication Data
US 2023/0369375 A1 Nov. 16, 2023

(30) Foreign Application Priority Data

May 16, 2022 (KR) .................. 10-2022-0059500

(51) Int. Cl.
H10F 39/18 (2025.01)
H04N 25/59 (2023.01)
H04N 25/76 (2023.01)
H10F 39/00 (2025.01)

(52) U.S. Cl.
CPC ............. H10F 39/18 (2025.01); H04N 25/59 (2023.01); H04N 25/7795 (2023.01); H10F 39/8037 (2025.01)

(58) Field of Classification Search
CPC ......... H01L 27/14643; H01L 27/14612; H01L 27/14605; H01L 27/1461; H01L 27/14614; H01L 27/14636; H04N 25/59; H04N 25/7795; H04N 25/57; H04N 25/616; H04N 25/709; H04N 25/79; H04N 25/76; H04N 25/13; H04N 25/78; H04N 25/766
See application file for complete search history.

(56) References Cited

U.S. PATENT DOCUMENTS

| | | | |
|---|---|---|---|
| 8,279,328 B2 | 10/2012 | Lahav et al. | |
| 8,710,419 B2 | 4/2014 | Bogaerts | |
| 8,754,357 B2 | 6/2014 | Meynants et al. | |
| 9,305,949 B2 | 4/2016 | Chen et al. | |
| 10,630,928 B2 | 4/2020 | Velichko | |
| 11,044,417 B2 | 6/2021 | Bitan et al. | |
| 2021/0313363 A1* | 10/2021 | Kwag | ................. H04N 25/671 |

* cited by examiner

Primary Examiner — Yogesh K Aggarwal
(74) Attorney, Agent, or Firm — Muir Patent Law, PLLC

(57) ABSTRACT

An image sensor is provided. The image sensor comprises a photodiode, a transmission transistor having a first end connected to the photodiode and a second end connected to a first node, a first switching transistor having a first end connected to the first node, a first capacitor having a first electrode connected to a second end of the first switching transistor, a second capacitor having a first electrode connected to the first node. A second electrode of the first capacitor is configured to receive a power voltage, and a second electrode of the second capacitor is configured to receive a boosting signal.

19 Claims, 30 Drawing Sheets

IMAGE SENSOR

CROSS-REFERENCE TO RELATED APPLICATION

Korean Patent Application No. 10-2022-0059500 filed on May 16, 2022 in the Korean Intellectual Property Office, and entitled "Image Sensor" is incorporated by reference herein in its entirety.

BACKGROUND

1. Field

The present disclosure relates to an image sensor.

2. Description of the Related Art

An image sensing device is a device for sensing an image by using an optical sensor. An image sensing device may include an image sensor. One type of image sensor is a CMOS image sensor. A CMOS image sensor may include a plurality of pixels PX that are arranged two-dimensionally. Each of the pixels may include a photodiode. The photodiode may serve to convert incident light into an electrical signal.

Recently, with the development of the computer industry and the communication industry, demand for image sensors with improved performance has been increasing in various fields such as digital cameras, camcorders, smart phones, game devices, security cameras, medical microcameras, robots, and vehicles.

SUMMARY

Embodiments are directed to an image sensor. An object of the present disclosure is to provide an image sensor that has improved image quality.

The objects of the present disclosure are not limited to what is mentioned above, and additional objects of the present disclosure, which are not mentioned herein, will be clearly understood by those skilled in the art from the following description of the present disclosure.

According to an aspect of the present disclosure, there is provided an image sensor including a photodiode; a transmission transistor having a first end connected to the photodiode and a second end connected to a first node; a first switching transistor having a first end connected to the first node; a first capacitor having a first electrode connected to a second end of the first switching transistor; and a second capacitor having a first electrode connected to the first node. A second electrode of the first capacitor is configured to receive a power voltage, and a second electrode of the second capacitor is configured to receive a boosting signal.

According to another aspect of the present disclosure, there is provided an image sensor including a photodiode; a transmission transistor having a first end connected to the photodiode and a second end connected to a first node; and a first capacitor having a first electrode connected to the first node and a second electrode connected to a capacitor voltage line applying a capacitor voltage signal. The capacitor voltage signal has a signal waveform that swings between a high voltage level and a low voltage level that is lower than the high voltage level.

According to another aspect of the present disclosure, there is provided an image sensor including a first photodiode; a second photodiode separated from the first photodiode; a first transmission transistor having a first end connected to the first photodiode and a second end connected to a first node; a first connection transistor having a first end connected to the first node and a second end connected to a second node; a second connection transistor having a first end connected to the second node and a second end connected to a third node; a second transmission transistor connected between the second photodiode and the third node; a first switching transistor having a first end connected to the third node; a first capacitor having a first electrode connected to a second end of the first switching transistor; and a second capacitor having a first electrode connected to the first node. A second electrode of the first capacitor is configured to receive a power voltage, and a second electrode of the second capacitor is configured to receive a boosting signal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
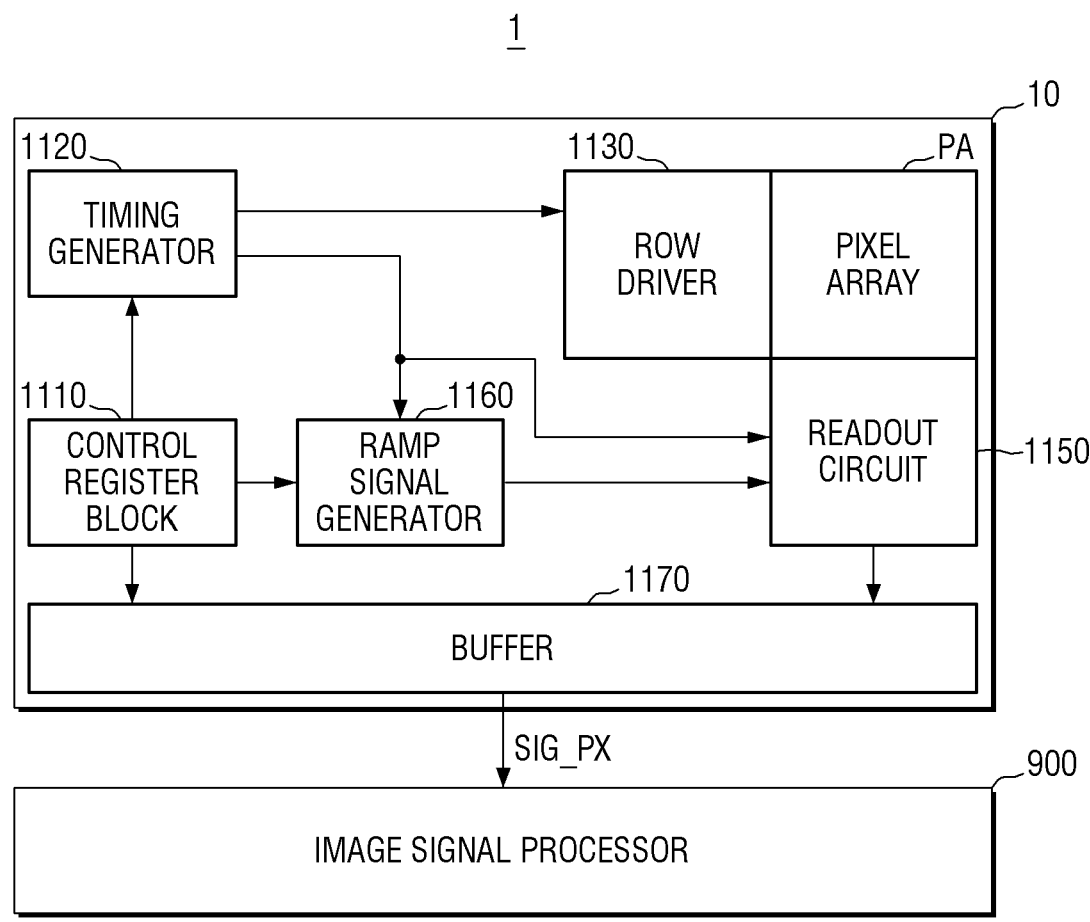
FIG. 1 is a block view illustrating an image sensing device according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a block view illustrating an image sensing device according to one embodiment.

Referring to FIG. 1, an image sensing device 1 may include an image sensor 10 and an image signal processor 900.

The image sensor 10 may generate a pixel signal SIG_PX by sensing an image of a sensing target using light. The generated pixel signal SIG_PX may be, for example, a digital signal, but is not limited thereto. Also, the pixel signal SIG_PX may be provided to the image signal processor 900 and then processed by the image signal processor 900.

The image sensor 10 may include a control register block 1110 (which may be referred to for convenience as simply a control block), a timing generator 1120, a row driver 1130, a pixel array PA, a readout circuit 1150, a ramp signal generator 1160, and a buffer unit 1170.

The control register block 1110 may control the operation of the image sensor 10. The control register block 1110 may transmit an operation signal directly to the timing generator 1120, the ramp signal generator 1160, and the buffer unit 1170.

The timing generator 1120 may generate a signal that is a reference to the operation timing of various components of the image sensor 10. The operation timing reference signal generated by the timing generator 1120 may be transferred to the row driver 1130, the readout circuit 1150, and the ramp signal generator 1160.

The ramp signal generator 1160 may generate and transmit a ramp signal used in the readout circuit 1150. The readout circuit 1150 may include a correlated double sampler CDS, a comparator, etc. The ramp signal generator 1160 may generate and transmit a ramp signal used in the correlated double sampler CDS, the comparator, or the like.

The buffer unit 1170 may temporarily store the pixel signal SIG_PX to be provided to the outside and transmit the pixel signal SIG_PX to an external memory or an external device. The buffer unit 1170 may include a memory such as a DRAM or an SRAM.

The pixel array PA may sense an external image. The pixel array PA may include a plurality of pixels PX (or unit pixels PX). The row driver 1130 may selectively activate the row of the pixel array PA.

The readout circuit 1150 may sample the pixel PX signal received from the pixel array PA, compare the sampled pixel PX signal with the ramp signal, and convert an analog image signal (data) into a digital image signal (data) based on the comparison result.

The image signal processor 900 may receive the pixel signal SIG_PX output from the buffer unit 1170 of the image sensor 10 and process the received pixel signal SIG_PX to facilitate display. The image signal processor 900 may be disposed to be physically separated from the image sensor 10. For example, the image sensor 10 may be mounted on a first chip, and the image signal processor 900 may be mounted on a second chip to perform communication with each other through a predetermined interface, but the embodiments are not limited thereto. The image sensor 10 and the image signal processor 900 may be implemented as one package, for example, a multi-chip package (MCP).

As described above, the image sensor may be provided in one chip. For example, all of the functional blocks described above may be implemented within one chip, but embodiments are not limited thereto. The functional blocks may be divisionally provided to a plurality of chips. When an image sensor is provided with a plurality of chips, each chip may be stacked. Hereinafter, an exemplary chip stack structure of the image sensor will be described.

Figure 2:
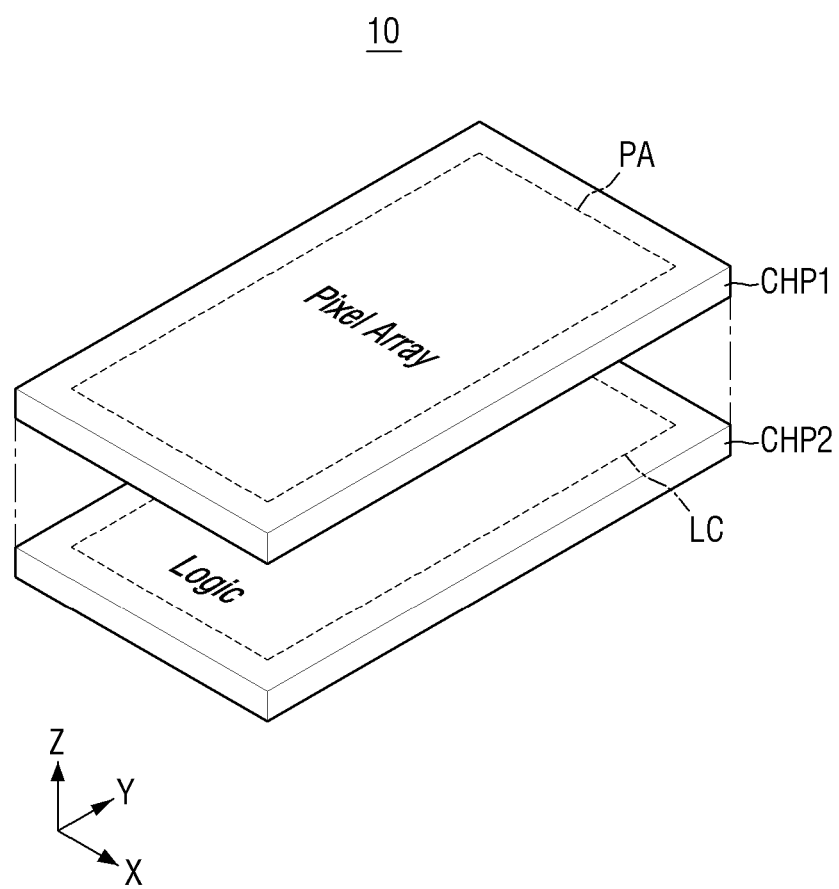
FIG. 2 is a schematic perspective view illustrating a stack structure of an image sensor according to one embodiment.

FIG. 2 is a schematic perspective view illustrating a stack structure of an image sensor according to one embodiment. In FIG. 2, a first direction X, a second direction Y, and a third direction Z are defined. The first direction X, the second direction Y, and the third direction Z cross one another. For example, the first direction X, the second direction Y, and the third direction Z may vertically cross one another. The first direction X and the second direction Y may correspond to horizontal directions, and the third direction Z may correspond to a vertical direction. The third direction Z in the device may indicate a thickness direction and/or a depth direction.

Referring to FIG. 2, the image sensor 10 may include an upper chip CHP1 and a lower chip CHP2, which are stacked. The upper chip CHP1 may include a pixel array PA. The lower chip CHP2 may include an analog area, which includes a readout circuit 1150, and a logic area LC. The lower chip CHP2 may be disposed below the upper chip CHP1 and may be electrically connected to the upper chip CHP1. The lower chip CHP2 may receive the pixel PX signal from the upper chip CHP1, and the logic area LC may receive the corresponding pixel PX signal.

Logic elements may be disposed in the logic area LC of the lower chip CHP2. The logic elements may include circuits for processing the pixel PX signal from pixels PX. For example, the logic elements may include the control register block 1110, the timing generator 1120, the row driver 1130, the readout circuit 1150, and the ramp signal generator 1160 of FIG. 1.

Figure 3:
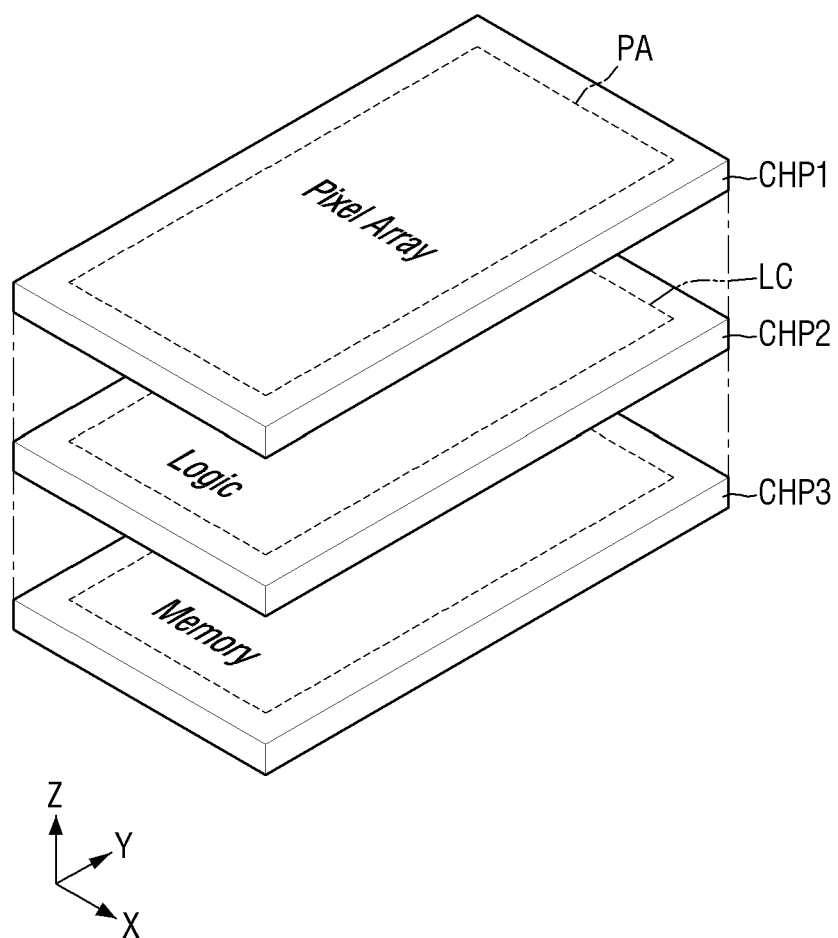
FIG. 3 is a schematic perspective view illustrating a stack structure of an image sensor according to another embodiment.

FIG. 3 is a schematic perspective view illustrating a stack structure of an image sensor according to another embodiment. Aspects of FIG. 3 that are similar to those of FIG. 2 will not be described since they have been described above with respect to FIG. 2. The embodiment of FIG. 3 is different from the embodiment of FIG. 2 in that the image sensor 11 further includes a memory chip CHP3.

In detail, as shown in FIG. 3, the image sensor 11 may include an upper chip CHP1, a lower chip CHP2, and a memory chip CHP3. The upper chip CHP1, the lower chip CHP2, and the memory chip CHP3 may be sequentially stacked along the third direction Z. The memory chip CHP3 may be disposed below the lower chip CHP2. The memory chip CHP3 may include a memory device. For example, the memory chip CHP3 may include a volatile memory device such as a DRAM, an SRAM, or the like. The memory chip CHP3 may receive a signal from the upper chip CHP1 and the lower chip CHP2 and may process the signal through the memory device. The image sensor 11, which includes the memory chip CHP3, may correspond to a three-stack image sensor.

Figure 4:
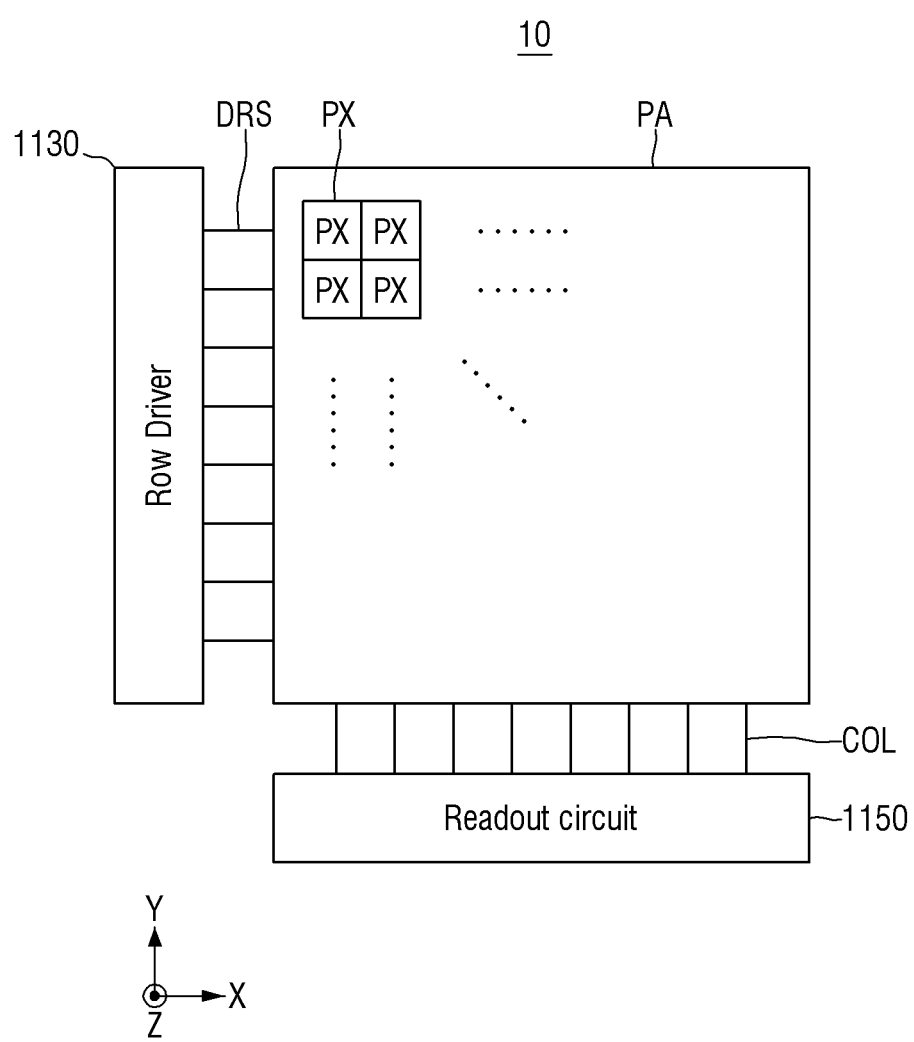
FIG. 4 is a block view illustrating an image sensor according to one embodiment.

Hereinafter, the pixel array PA of the image sensor will be described in more detail. FIG. 4 is a block view illustrating an image sensor according to one embodiment.

Referring to FIG. 4, the pixel array PA may include a plurality of pixels PX. Each pixel PX may be a sensing basic unit for receiving light and outputting an image corresponding to that pixel PX. Each pixel PX may include a photoelectric conversion unit.

The plurality of pixels PX may be arranged in a two-dimensional matrix shape having a plurality of rows and a plurality of columns. For convenience of description, the row refers to an arrangement that is extended in the first direction X in FIG. 4, and the column refers to an arrangement that is extended in the second direction Y, but the arrangement to which the rows and columns refer may be reversed. In addition, although the drawing illustrates that a planar shape formed by intersection of the row and the column is a rectangular matrix shape, various modifications may be made in the matrix shape of the pixel (PX). For example, an extension direction of a row or a column may be a zigzag shape rather than a straight line, and pixels PX positioned in adjacent rows/columns may be disposed to be alternate with each other.

A plurality of driving signal lines DRS are connected to the row driver 1130. The plurality of driving signal lines DRS may be extended along a row extension direction (i.e., the first direction X). The plurality of driving signal lines DRS may traverse an active area of the pixel array PA, which is an effective area in which the pixels PX are disposed, in the first direction X. The plurality of driving signal lines DRS may transfer the driving signal provided from the row driver to the pixels PX. The driving signal may include, for example, a selection signal, a reset signal, a transmission signal, and the like.

In one embodiment, the pixels PX positioned in the same row may be connected to the same driving signal line DRS. In addition, the pixels PX positioned in different rows may be connected to different driving signal lines DRS, but the embodiments are not limited thereto. The pixels PX positioned in the same row may be connected to different driving signal lines DRS, or the pixels PX positioned in two or more rows may be connected to the same driving signal line DRS.

A plurality of output signal lines COL may be connected to the readout circuit 1150. The plurality of output signal lines COL may be extended along a column extension direction (i.e., the second direction Y). The plurality of output signal lines COL may traverse the active area of the pixel array PA in the second direction Y. The plurality of output signal lines COL may transfer the output signal provided from the pixels PX to the readout circuit 1150.

In one embodiment, pixels PX positioned in the same column may be connected to the same output signal line COL. In addition, the pixels PX positioned in different columns may be connected to different output signal lines COL, but the embodiments are not limited thereto. The pixels PX positioned in the same column may be connected to different output signal lines COL, or the pixels PX positioned in two or more columns may be connected to the same output signal line COL.

Figure 5:
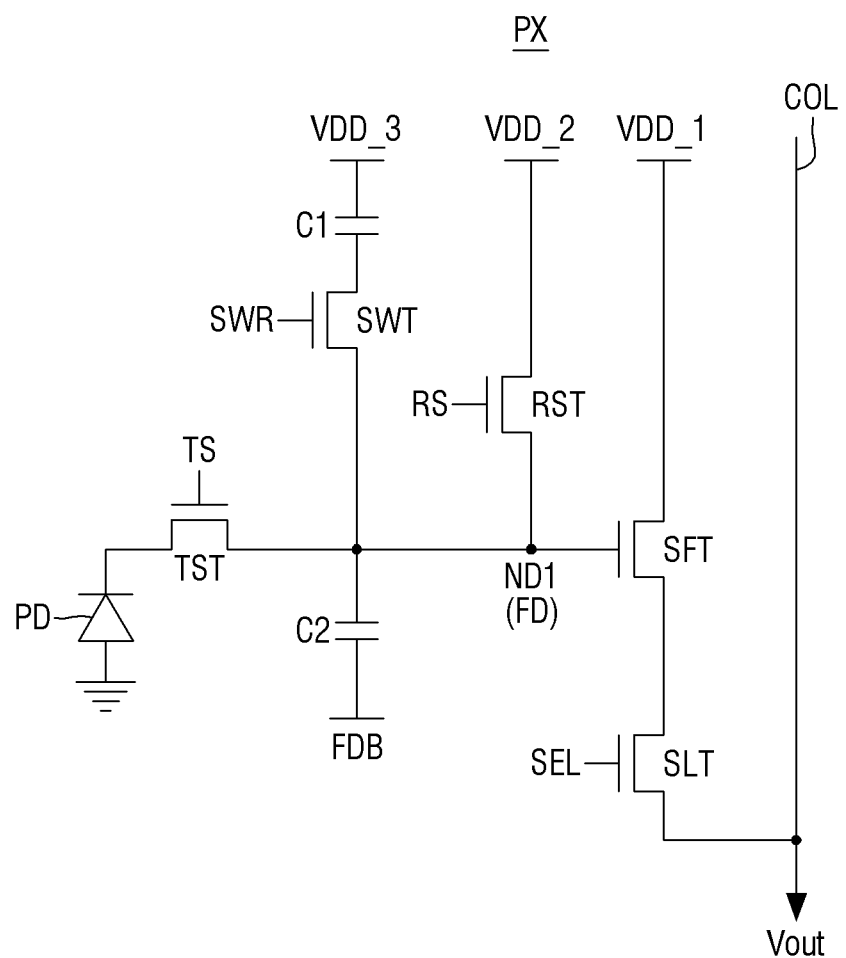
FIG. 5 is a circuit view illustrating a pixel of an image sensor according to one embodiment.

FIG. 5 is a circuit view illustrating a pixel of an image sensor according to one embodiment. In FIG. 5, for example, a circuit view of a pixel PX positioned in an $i^{th}$ row and a $j^{th}$ column is illustrated. In the corresponding position, gates of a transmission transistor TST, a reset transistor RST, a switching transistor SWT, and a selection transistor SLT of the pixel PX may be connected to an $i^{th}$ transmission line TSi, reset line RS, switching line SWR, and selection line SEL, respectively. A second capacitor C2 may be connected to an $i^{th}$ boosting line.

The output of a source follower transistor SFT may be connected to a $j^{th}$ output signal line.

A first power voltage VDD_1, a second power voltage VDD_2, and a third power voltage VDD_3 may be connected to a first power line, a second power line, and a third power line, respectively. The first power line, the second power line, and the third power line may be connected to the plurality of pixels PX. In one embodiment, the first power line, the second power line, and the third power line may be common lines connected to all pixels PX to transfer the same voltage to all pixels PX.

The first power voltage VDD_1, the second power voltage VDD_2, and the third power voltage VDD_3 may be different from one another or may be the same as one another. For example, the first power line, the second power line, and the third power line may be connected to one another. The power voltages VDD_1, VDD_2 and VDD_3 may be reference voltages (e.g., DC voltages) that do not swing, but are not limited thereto.

Referring to FIG. 5, the pixel PX circuit includes a photodiode PD, a floating diffusion region FD, a plurality of transistors, and a plurality of capacitors. Although FIG. 5 shows that the plurality of transistors are NMOS transistors, the present disclosure is not limited thereto. The plurality of transistors may be PMOS transistors, a portion thereof may be an NMOS transistor, or another portion thereof may be a PMOS transistor.

The plurality of transistors may include, but are not limited to, a transmission transistor TST, a source follower transistor SFT, a selection transistor SLT, a reset transistor RST, and a switching transistor SWT. The plurality of capacitors may include a first capacitor C1 and a second capacitor C2.

The photodiode PD may be a kind of photoelectric conversion elements and may generate charges from light incident on the pixel PX from the outside. The photodiode PD may generate charges in proportion to the amount of incident light. Some or all of the generated charges may be accumulated in the photodiode PD.

The floating diffusion region FD is denoted by a first node ND1 and is supplied with the charges generated by the photodiode PD through the transmission transistor TST. The floating diffusion region FD is located at the same position as the first node ND1 in the circuit view and is sometimes used interchangeably with the first node ND1.

Since the floating diffusion region FD has parasitic capacitance, charges may be stored by being accumulated. The floating diffusion region FD may serve to convert charges into voltages.

The transmission transistor TST is disposed between the photodiode PD and the floating diffusion region FD. A first end of the transmission transistor TST may be connected to the photodiode PD, and a second end thereof of the transmission transistor TST may be connected to the floating diffusion region FD. The gate of the transmission transistor TST is connected to a transmission line of a corresponding row. The transmission transistor TST may transmit the charges accumulated in the photodiode PD to the floating diffusion region FD in accordance with a transmission signal TSi input from the transmission line.

The source follower transistor SFT is connected between the first power line providing the first power voltage VDD_1 and an output signal line COLj. The gate of the source follower transistor SFT is connected to the floating diffusion region FD. An output value of the source follower transistor SFT is adjusted by the charges applied to the floating diffusion region FD connected to the gate.

The selection transistor SLT is disposed between the source follower transistor SFT and the output signal line COLj. The gate of the selection transistor SLT is connected to the selection line of the corresponding row. The selection transistor SLT electrically connects the source follower transistor SFT to the output signal line COLj in accordance with a selection signal SELi input through the selection line.

Although different signals TSi, COLj, SELi, and RSi may be provided to each respective pixel, for ease of disclosure, these signals will be referred to as TS, COL, SEL, and RS.

The reset transistor RST may be provided to reset the floating diffusion region FD. The reset transistor RST is disposed between the second power line providing the second power voltage VDD_2 and the floating diffusion region FD.

The gate of the reset transistor RST is connected to the reset line of the corresponding row. The reset transistor RST may connect the floating diffusion region FD to a second power voltage terminal in accordance with a reset signal RSi input through the reset line to reset the floating diffusion region FD to the second power voltage VDD_2.

The switching transistor SWT is connected between the floating diffusion region FD and the first capacitor C1. The gate of the switching transistor SWT is connected to the switching line of the corresponding row. The switching transistor SWT connects the first node ND1 with the first capacitor C1 in accordance with a switching control signal SWR input through the switching line.

The first capacitor C1 is disposed between the switching transistor SWT and the third power line supplying the third power voltage VDD_3. The first capacitor C1 may serve to store charges overflowed from the photodiode PD. That is, the first capacitor C1 may be a kind of a storage capacitor.

One electrode of the first capacitor C1 is connected to the source/drain area of the switching transistor SWT. The other electrode of the first capacitor C1 is connected to the third power line to receive the third power voltage VDD_3. The first capacitor C1 is connected to the floating diffusion region FD through the switching transistor SWT.

The first capacitor C1 may be a metal capacitor having one electrode and the other electrode, which are both made of metal, but it is not limited thereto.

The second capacitor C2 is connected between the floating diffusion region FD and a boosting line. One electrode of the second capacitor C2 may be connected to the floating diffusion region FD, and the other electrode thereof may be connected to the boosting line of the corresponding row. The second capacitor C2 may serve to boost the potential of the floating diffusion region FD in accordance with a boosting signal FDB transferred to the boosting line. That is, the second capacitor C2 may be a kind of a boosting capacitor.

Hereinafter, the operation of the pixel circuit will be described.

Figure 6:
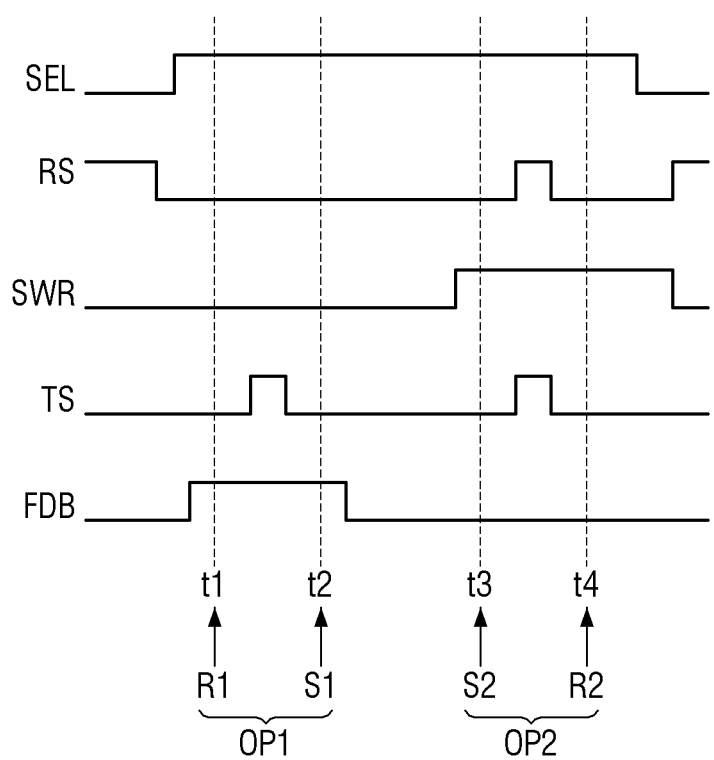
FIG. 6 is an exemplary timing view illustrating an operation of one pixel having the circuit structure of FIG. 5.

FIG. 6 is an exemplary timing view illustrating an operation of one pixel having the circuit structure of FIG. 5. FIG. 6 illustrates the timing of a signal applied to one pixel PX positioned in a row to be read out at the corresponding timing point. At the same timing point, pixels PX corresponding to other rows that are not selected for readout targets may be applied with signals different from the illustrated example. For example, the pixels PX corresponding to other rows that are not selected as readout targets may be applied with signal waveforms appearing before or after two operations OP1 and OP2 of FIG. 6.

In the timing view of FIG. 6, waveforms of a selection signal SEL, a reset signal RS, the switching control signal SWR, a transmission signal TS, and the boosting signal FDB are sequentially illustrated. Each signal waveform swings between a high level voltage and a low level voltage. Among the above signal waveforms, except for the boosting signal FDB, the high level voltage may be a turn-on signal that turns on a transistor that is applied, and the low level voltage may be a turn-off signal that turns off a transistor that is applied. Although the transmission signal TS may actually be a specific transmission signal TSi, it will be referred to as the transmission signal TS for ease of disclosure.

Referring to FIGS. 5 and 6, the readout of the pixel PX may include two operations. In detail, the readout of the pixel PX may include a first operation OP1 and a second operation OP2, which are sequentially performed in a time order. Each operation includes a signal operation S1 or S2, and may further include a reset operation R1 or R2. The reset operation within one operation may be performed before the signal operation or may be performed after the signal operation. In some operations, the reset operation may be omitted. During two operations, the selection signal SEL maintains a high level.

During the time before the readout, that is, during the time before the first operation OP1, the selection signal SEL, the switching control signal SWR, the transmission signal TS, and the boosting signal FDB maintain a low level, and the reset signal RS maintains a high level.

In the first operation OP1, after the first reset operation R1 is first performed at a first time t1, the first signal operation S1 may be performed at a second time t2.

In detail, the selection signal SEL is switched from a low level to a high level, the reset signal RS is switched from a high level to a low level, and the switching control signal SWR and the transmission signal TS maintain the existing low level until the first time t1 at which the first reset operation R1 is performed. In addition, the boosting signal FDB is switched from a low level to a high level until the first time t1 at which the first reset operation R1 is performed. That is, the boosting signal FDB of a high level may be applied to one electrode of the second capacitor C2. Therefore, the potential of the first node ND1 connected to the other electrode of the second capacitor C2, that is, the potential of the floating diffusion region FD may be increased. In this step, the potential rise of the floating diffusion region FD may be proportional to the magnitude of the boosting signal FDB.

The charges accumulated in the first node ND1 may be converted to a first reset voltage VR1 through the source follower transistor SFT and then output during the first reset operation R1.

Next, the first signal operation S1 may be performed at the second time t2. During a time period between the first time t1 and the second time t2, the transmission signal TS may be switched from a low level to a high level and then converted to a low level. While the transmission signal TS maintains a high level, the transmission transistor TST may be turned on for a predetermined time and then turned off. The first node ND1 may be connected to the photodiode PD during the time when the transmission transistor TST is turned on. As a result, the charges stored in the photodiode PD may be transferred to the first node ND1 (i.e., floating diffusion region). The charges transferred to the first node ND1 may be converted into the first signal voltage VS1 by the source follower transistor SFT and then output. In this step, since the boosting signal FDB maintains a high level, a potential of the floating diffusion region FD rises to correspond to the boosting signal FDB. In this way, when the potential of the floating diffusion region FD is increased, transmission efficiency due to the transmission transistor TST may be increased. This will be described later in detail.

Subsequently to the first operation OP1, the second operation OP2 is performed. In the second operation OP2, after the second signal operation S2 is first performed at a third time t3, the second reset operation R2 may be performed at a fourth time t4.

In detail, during a time period between the second time t2 and the third time t3, the boosting signal FDB is switched from a high level to a low level. Therefore, the potential of the first node ND1 may return to the state before rising by the boosting signal FDB. Further, the switching control signal SWR is switched from a low level to a high level to turn on the switching transistor SWT. As a result, the first capacitor C1 may be connected to the first node ND1. Therefore, the charges accumulated in the first capacitor C1 during the above time period may be transferred to the first node ND1. The charges transferred to the first node ND1 may be converted into the second signal voltage VS2 by the source follower transistor SFT and then output.

Next, the second reset operation R2 may be performed at the fourth time t4. The reset signal RS and the transmission signal TS may be switched from a low level to a high level and then switched to a low level between the third time t3 and the fourth time t4. While the reset signal RS and the transmission signal TS are maintained at a high level, the reset transistor RST and the transmission transistor TST are turned on, so that the charges of the photodiode PD and the first node ND1 may be reset. The reset charges of the photodiode PD and the first node ND1 may be converted into the second reset voltage VS2 by the source follower transistor SFT and then output.

After the second operation OP2, the selection signal SEL and the switching control signal SWR may be switched from a high level to a low level, and the reset signal RS may be switched from a low level to a high level.

Figure 7:
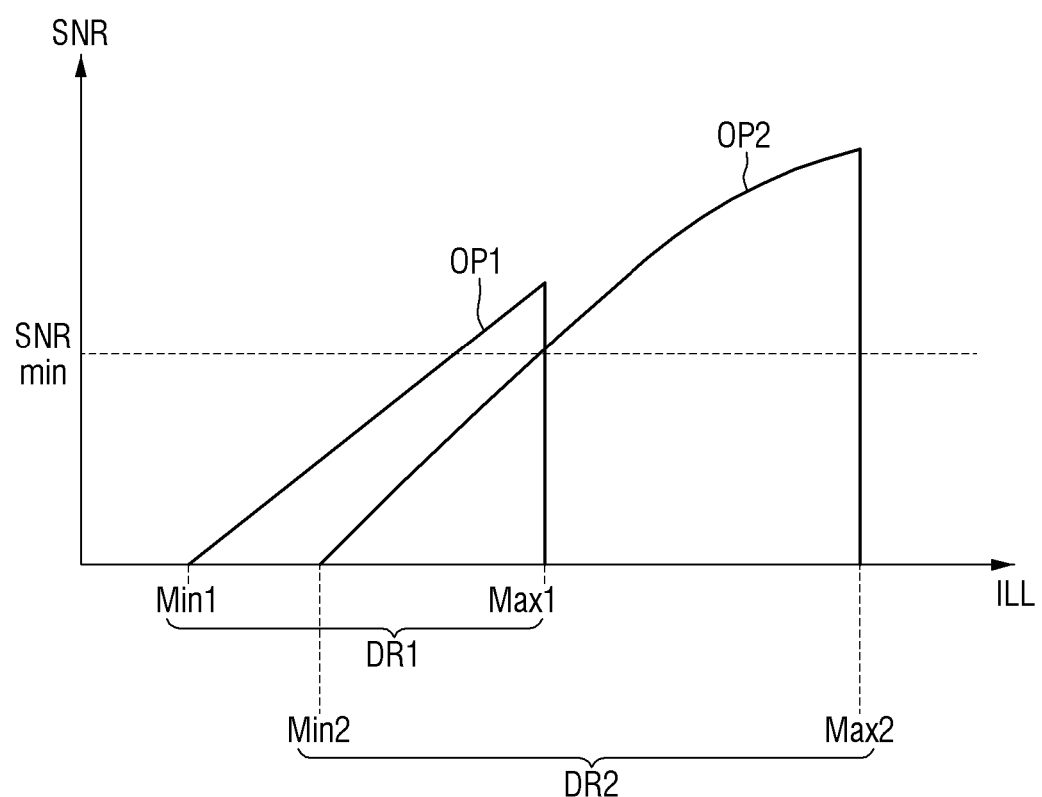
FIG. 7 is an exemplary graph showing a signal-to-noise ratio according to illuminance of a pixel by the pixel operation of FIG. 6.

FIG. 7 is a graph showing a signal-to-noise ratio (SNR) according to illuminance of a pixel (ILL) by the pixel operation of FIG. 6.

As shown in FIG. 7, the image sensor senses a minimum illuminance Min1 or Min2 and the maximum illuminance Max1 or Max2 during the operation of the pixel PX. The minimum illuminances Min1 and Min2 and the maximum illuminances Max1 and Max12 are each associated with a dynamic range. As described above, the first operation OP1 and the second operation OP2 are different from each other in circuit connection. Therefore, minimum illuminance and maximum illuminance may be different for each operation. That is, a different dynamic range may be given to each detailed operation.

For example, in the first operation OP1 that outputs charges generated from the photodiode PD and transferred to the first node ND1, since the first node ND1 is separated from the first capacitor C1 having a relatively large capacitance, the pixel PX has a relatively small capacitance. Therefore, a first dynamic range DR1 of the first operation OP1 may have a dynamic range of low illuminance, thereby being useful for image sensing of a low illuminance environment.

In the second operation OP2, charges are output to the first capacitor C1. Since the first capacitor C1 has a relatively large capacitance, the second dynamic range DR2 implemented by the second operation OP2 may have a dynamic range of high illuminance. In detail, the first dynamic range DR1 and the second dynamic range DR2 partially overlap each other, and a minimum illuminance Min2 of the second dynamic range DR2 may be positioned between a minimum illuminance Min1 and a maximum illuminance Max1 of the first dynamic range DR1, and its maximum illuminance Max2 may be greater than the maximum illuminance Max1 of the first dynamic range DR1. The second dynamic range DR2 may be useful for image sensing of a high illuminance environment.

As described above, a circuit connection to one pixel PX may be diversified to set a dynamic range DR of various ranges. Therefore, since the pixel PX may output a signal having a full dynamic range that includes the first and second dynamic ranges DR1 and DR2, a full-well capacity FDR of the image sensor may be increased. In addition, as the plurality of dynamic ranges are set to overlap, the output equal to or greater than a reference signal-to-noise ratio SNRmin, which is the minimum reference required in a wide illuminance range, may be obtained, and thus image sensing quality may be improved.

Hereinafter, the increase of transmission efficiency by the boosting signal FDB will be described.

Figure 8:
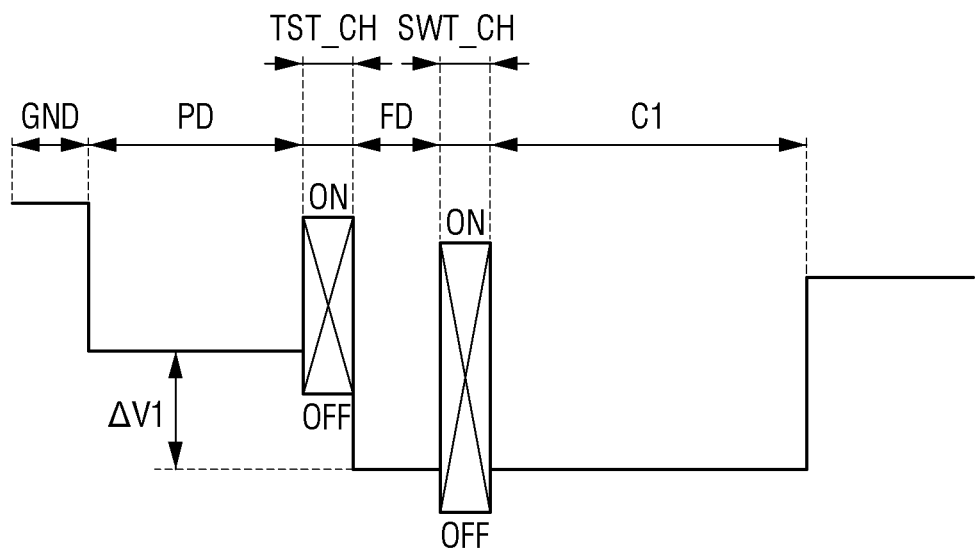
FIGS. 8 and 9 are views illustrating a potential level of a portion of a pixel according to a boosting signal according to one embodiment.
Figure 9:
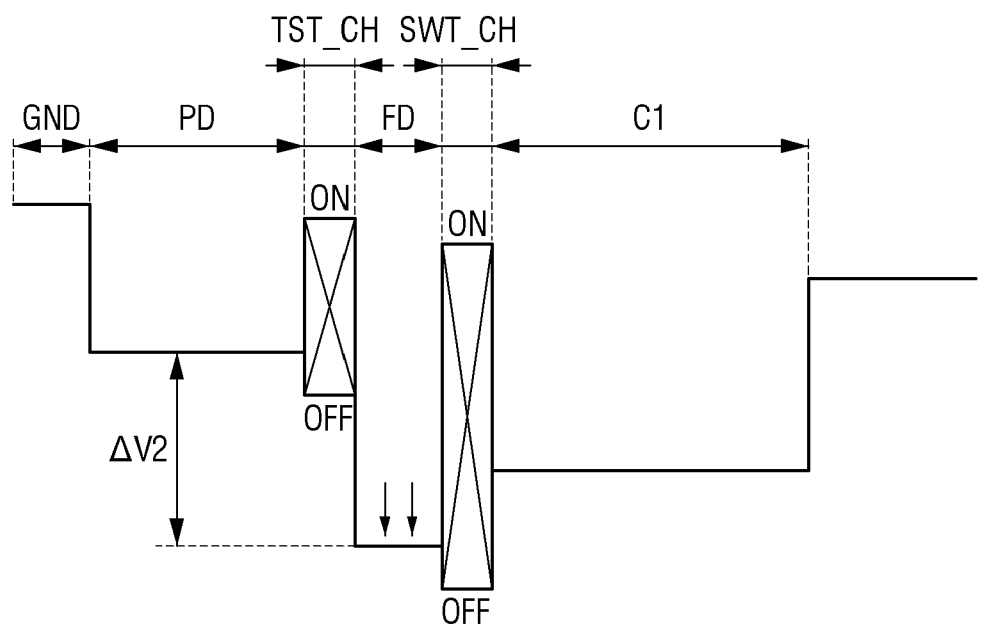

FIGS. 8 and 9 are exemplary views illustrating a potential level of a portion of a pixel according to a boosting signal. In FIGS. 8 and 9, potential levels of the photodiode PD, a channel area TST_CH of the transmission transistor TST, the floating diffusion region FD, a channel area STW_CH of the switching transistor SWT, and the first capacitor C1 are shown. FIG. 8 illustrates a potential level when the pixel PX receives a boosting signal of a low level, and FIG. 9 shows a potential level when the pixel PX receives a boosting signal of a high level.

Referring to FIGS. 8 and 9, when light is received in the photodiode PD, a charge-hole pair may be generated. The generated charges may be accumulated in the photodiode PD. A portion of the charges generated in the photodiode PD may be overflowed toward the floating diffusion region FD and the first capacitor C1. The first capacitor C1 may have a capacity larger than that of the floating diffusion region FD. Therefore, the first capacitor C1 may accumulate a large amount of charges that are overflowed.

Figure 10:
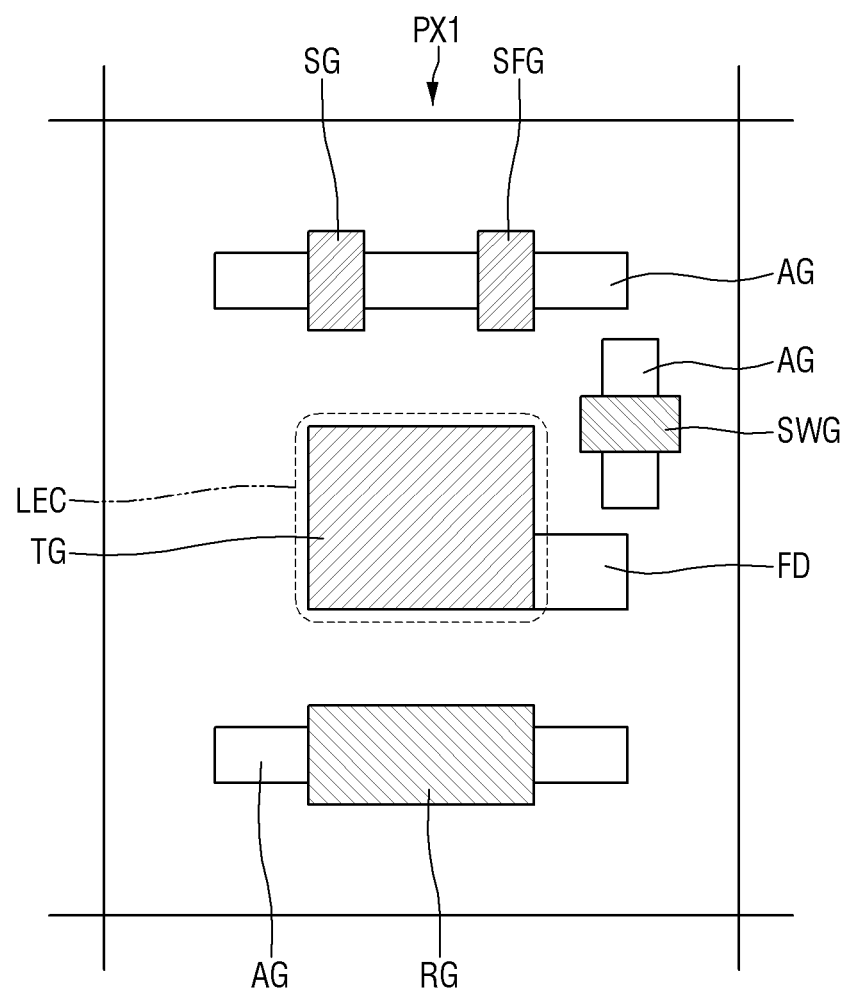
FIG. 10 is a schematic layout view of a pixel according to one embodiment.

When the transmission transistor TST is turned on, the charges accumulated in the photodiode PD may be transmitted to the floating diffusion region FD as a potential barrier between the photodiode PD and the floating diffusion region FD is removed. Transmission efficiency of the photodiode PD may be proportional to potential differences ΔV1 and ΔV2 between the photodiode PD and the floating diffusion region FD. That is, as the potential differences ΔV1 and ΔV2 between the photodiode PD and the floating diffusion region FD are increased, the floating diffusion region FD may more strongly pull charges located in the photodiode PD. As described above, when the boosting signal FDB has a signal of a high level, the potential of the floating diffusion region FD may be increased by coupling through the second capacitor C2. That is, when the boosting signal FDB of a high level is applied as shown in FIG. 10, a larger potential difference between the photodiode PD and the floating diffusion region FD may be exhibited than when the boosting signal FDB of a low level is applied as shown in FIG. 9 (i.e., ΔV2>ΔV1). Therefore, the charges remaining in the photodiode PD may be minimized by increasing transmission efficiency of the photodiode PD, whereby image sensing may be performed more exactly.

As shown in FIG. 6, a high-level duration of the boosting signal FDB in the first operation OP1 may overlap a high-level duration of the transmission signal TS. In detail, the high-level duration of the boosting signal FDB may be greater than or equal to the high-level duration of the transmission signal TS in the same operation. In the first operation OP1, a rising edge of the boosting signal FDB may be positioned before a rising edge of the transmission signal TS, and a falling edge of the boosting signal FDB may be positioned after a falling edge of the transmission signal TS.

Meanwhile, as shown in FIG. 6, when the boosting signal FDB is at a high level, the switching control signal SWR maintains a low level. Therefore, since the switching transistor SWR is turned off at the corresponding timing point, the floating diffusion region FD may not be electrically connected to the first capacitor C1.

Unlike FIG. 6, when the boosting signal FDB is applied in a state in which the first capacitor C1 having a large capacity is connected to the floating diffusion region FD, the total capacitance connected to the floating diffusion region FD will have a very large value. As the capacitance connected to the floating diffusion region FD is increased, the increase in the potential by the boosting signal FDB may be reduced. Therefore, boosting efficiency for the floating diffusion region FD is reduced, and more power consumption is required for sufficient boosting. As in the embodiment of FIG. 6, when the switching transistor SWR is turned off at a boosting period, boosting deterioration caused by the first capacitor C1 may be minimized, whereby good boosting efficiency may be obtained.

Subsequently, a schematic structure of the above-described pixel PX will be described.

FIG. 10 is an exemplary schematic layout view of a pixel according to one embodiment. In the layout of FIG. 10, a relative position among a gate of a transistor, a photoelectric conversion area, and a floating diffusion region, which are disposed in the pixel, is shown.

Referring to FIG. 10, the pixel PX includes a photoelectric conversion area LEC. The photoelectric conversion area LEC may correspond to the photodiode PD of FIG. 5. The photoelectric conversion area LEC may generate charges in proportion to the amount of light incident from the outside.

In addition, a gate (hereinafter, transfer gate TG) of the transmission transistor TST, a gate (hereinafter, source follower gate SFG) of the source follower transistor SFT, a gate (hereinafter, selection gate SG) of the selection transistor SLT, a gate (hereinafter, reset gate RG) of the reset transistor RST, and a gate (hereinafter, switching gate SWG) of the switching transistor SWT are disposed within one pixel PX. In FIG. 10, the transfer gate TG is positioned at a central portion of the pixel PX area, the selection gate SG and the source follower gate SFG are disposed at one side (upper portion in FIG. 10) of the transfer gate TG in a second direction Y in parallel in a first direction X, the reset gate RG is disposed at the other side (lower portion of FIG. 10) of the transfer gate TG in the second direction Y, and is disposed at one side (right side in FIG. 10) of the transfer gate TG in the first direction X, but various modifications may be made in their relative position relations. Although a planar shape of each gate is illustrated as being rectangular or square, various modifications may be made in the planar shape.

On a plan view, the transfer gate TG may at least partially overlap the photoelectric conversion area LEC. In this case, the overlap reference is the third direction Z that is a thickness direction. In one embodiment, the transfer gate TG on a plan view may be positioned inside the photoelectric conversion area LEC. In the drawing, the source follower gate SFG, the reset gate RG, the selection gate SG, and the switching gate SWG do not overlap the photoelectric conversion area LEC, but at least one or all of them may overlap the photoelectric conversion area LEC or be positioned inside the photoelectric conversion area on a plan view.

A transistor active area AG may be disposed near the respective gates. The transistor active area includes an impurity area, and the impurity area may be utilized as a source/drain area and/or a floating diffusion region FD of the transistor. In some embodiments, the source/drain area of the transistor may include a first source/drain area and a second source/drain area. Each of the first source/drain area and the second source drain area of the same transistor may be a source area or a drain area depending on voltages applied thereto. When the applied voltages are equally maintained, any one of the first source/drain area and the second source/drain area of the same transistor may be a source area, and the other one may be a drain area.

One or more transistor active areas AG may be disposed in one pixel PX. When a plurality of transistor active areas AG are provided, the respective transistor active areas AG may be separated from each other.

The floating diffusion region FD may be disposed at one side of the transfer gate TG. On a plan view, the floating diffusion region FD may be adjacent to the transfer gate TG. Although a portion of the floating diffusion region FD overlaps the photoelectric conversion area LEC in the drawing, the floating diffusion region FD may not completely overlap the photoelectric conversion area LEC or may fully overlap the photoelectric conversion area LEC.

A first source/drain area of the reset transistor RST may be disposed at one side of the reset gate RG, and a second source/drain area of the reset transistor RST may be disposed at the other side of the reset gate RG.

A first source/drain area of the selection transistor SLT may be disposed at one side of the selection gate SG, and a second source/drain area thereof may be disposed at the other side of the selection gate SG. In addition, a first source/drain area of the source follower transistor SFT may be disposed at one side of the source follower gate SFG, and a second source/drain area thereof may be disposed at the other side of the source follower gate SFG. The second source/drain area of the selection transistor SLT and the first source/drain area of the source follower transistor SFT may be circuitally connected to the same node and may be physically formed in a single body.

A first source/drain area of the switching transistor SWT may be disposed at one side of the switching gate SWG, and a second source/drain area thereof may be disposed at the other side of the switching gate SWG.

Figure 11:
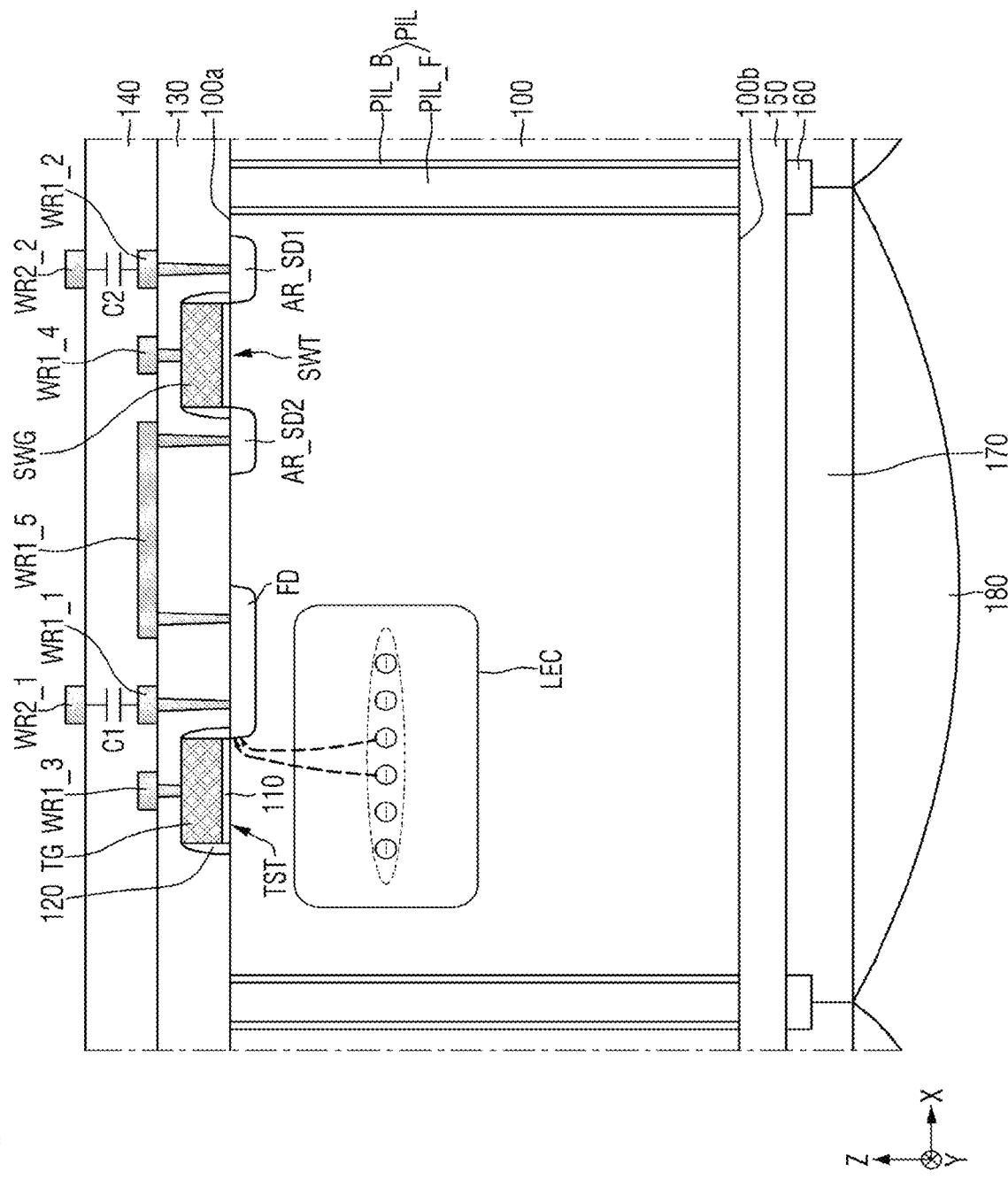
FIG. 11 is an exemplary cross-sectional view illustrating the pixel of FIG. 10.

FIG. 11 is a cross-sectional view illustrating the pixel of FIG. 10.

Referring to FIGS. 10 and 11, the image sensor or the pixel PX included in the image sensor may include a substrate 100, a photoelectric conversion area LEC, an active area AR4, a source/drain area AR, a pixel isolation layer PIL, a gate TG, a gate insulating layer 110, and a gate spacer 120. In the cross-sectional view of FIG. 11, a transfer gate TG and a switching gate SWG are shown as gates, and a floating diffusion region FD, a first source/drain area AR_SD1 and a second source/drain area AR_SD2 of the switching transistor SWT are shown as the transistor active areas and will be described based on the contents shown in the cross-sectional view.

The substrate 100 may be a semiconductor substrate. For example, the substrate 100 may be a bulk silicon or a silicon-on-insulator (SOI). The substrate 100 may be a silicon substrate, or may include other materials such as silicon germanium, indium antimonide, lead telluride compound, indium arsenide, indium phosphide, gallium arsenide or gallium antimonide. The substrate 100 may be an epitaxial layer formed on a base substrate.

The substrate 100 may include a first surface 100a and a second surface 100b, which are opposite to each other. In the following embodiments, the first surface 100a may be referred to as a front side of the substrate 100, and the second surface 100b may be referred to as a back side of the substrate 100. The second surface 100b of the substrate 100 may be a light receiving surface on which light is incident. That is, the image sensor according to some embodiments may be a backside illuminated (BSI) image sensor.

In some embodiments, the substrate 100 may have a first conductivity type. For example, the substrate 100 may include p-type impurities (e.g., boron (B)). Although the first conductivity type is described as a p-type in the following embodiments, this is only exemplary, and the first conductivity type may be an n-type.

The photoelectric conversion area LEC may be disposed inside the substrate 100. The photoelectric conversion area LEC may be positioned in a space between the first surface 100a and the second surface 100b. The photoelectric conversion area LEC may be spaced apart from the first surface 100a and the second surface 100b at a predetermined distance.

The photoelectric conversion area LEC may have a second conductivity type different from the first conductivity type. In the following embodiments, the second conductivity type is described as n-type, but this is only exemplary, and the second conductivity type may be a p-type. The photoelectric conversion area LEC may be formed by ion implantation of n-type impurities (e.g., phosphorus (P) or arsenic (As)) into the p-type substrate 100.

The impurities implanted into the photoelectric conversion area LEC may have different concentrations for each area. The ion-implanted impurities may be diffused into the substrate 100. The entire volume of the photoelectric conversion area LEC may be expanded through this diffusion process, and a different concentration may be provided for each area.

The floating diffusion region FD may be disposed inside the substrate 100. The floating diffusion region FD may be disposed to be adjacent to the first surface 100a of the substrate 100. The floating diffusion region FD may be spaced apart from the photoelectric conversion area LEC in the third direction Z (i.e., thickness direction).

The floating diffusion region FD may have the second conductivity type. For example, the floating diffusion region FD may be a first impurity area formed by ion-implantation of n-type impurities into the p-type substrate 100, but this is only exemplary, and the second conductivity type may be a p-type with a p-type FD region formed in an n-type substrate 100.

In some embodiments, the floating diffusion region FD may have the second conductivity type as an impurity concentration higher than that of the photoelectric conversion area LEC. For example, the floating diffusion region FD may be formed by ion-implantation of n-type impurities (n+) of high concentration into the p-type substrate 100.

The first source/drain area AR_SD1 and the second source/drain area AR_SD2 may be disposed inside the substrate 100. The first source/drain area AR_SD1 and the second source/drain area AR_SD2 may be disposed to be adjacent to the first surface 100a of the substrate 100.

The first source/drain area AR_SD1 and the second source/drain area AR_SD2 may have the second conductivity type. For example, the floating diffusion region FD may be a first impurity area formed by ion-implantation of n-type impurities into the p-type substrate 100, but this is only exemplary.

In some embodiments, the first source/drain area AR_SD1 and the second source/drain area AR_SD2 may have the second conductivity type as an impurity concentration higher than that of the photoelectric conversion area LEC. For example, the first source/drain area AR_SD1 and the second source/drain area AR_SD2 may be formed by ion-implantation of n-type impurities (n+) having the same concentration as that of the floating diffusion region FD, but are not limited thereto.

The pixel isolation layer PIL may be further disposed inside the substrate 100. The pixel isolation layer PIL may serve to mutually separate adjacent pixels PX. The pixel isolation layer PIL may serve to block drift of charges between the pixels PX.

The pixel isolation layer PIL may be disposed in a boundary area of the pixels PX on a plan view. The pixel isolation layer PIL may be continuously disposed along the boundary of the pixels PX on a plan view. On the plan view, the pixel isolation layer PIL may have a lattice shape.

In one embodiment, the pixel isolation layer PIL may be extended from the first surface 100a to the second surface 100b of the substrate 100. Based on the extension direction, one end of the pixel isolation layer PIL may be placed on the first surface 100a of the substrate 100, and the other end thereof may be placed on the second surface 100b of the substrate 100. In other words, the pixel isolation layer PIL may have a shape that passes through the substrate 100 in the third direction Z but is not limited thereto. One end or the other end of the pixel isolation layer PIL may be positioned inside the substrate 100 like a trench shape.

The pixel isolation layer PIL may be formed by removing a component material of the substrate 100 and then filling the removed space with an isolation layer material.

In one embodiment, the pixel isolation layer PIL may include a barrier layer PIL_B and a filling layer PIL_F.

The barrier layer PIL_B may form a sidewall of the pixel isolation layer PIL. The barrier layer PIL_B may include, but is not limited to, a high dielectric constant insulating material. The barrier layer PIL_B defines a predetermined space, and the filling layer PIL_F may be disposed in the space. The filling layer PIL_F may include, but is not limited to, a material having excellent gap-fill performance, for example, poly-Si.

The transfer gate TG and the switching gate SWG may be disposed on the first surface 100a of the substrate 100. One side of the transfer gate TG may be aligned with or overlapped with one edge of the floating diffusion region FD. One side of the switching gate SWG may be aligned with or overlapped with one edge of the first source/drain region AR_SD1, and the other side thereof may be aligned with or overlapped with one edge of the second source/drain region AR_SD2.

The transfer gate TG and the switching gate SWG may include, for example, at least one of poly-Si doped with impurities, a metal silicide such as cobalt silicide, a metal nitride such as a titanium nitride, or a metal such as tungsten, copper and aluminum, but are not limited thereto.

The gate insulating layer 110 may be disposed on the first surface 100a of the substrate 100. The gate insulating layer 110 may be disposed between the transfer gate TG and the substrate 100 and between the switching gate SWG and the substrate 100. The gate insulating layer 110 may include, but is not limited to, at least one of silicon nitride (SiN), silicon oxynitride (SiON), silicon carbonitride (SiCN), a low-k material having a dielectric constant lower than that of silicon oxide, or a high-k material having a dielectric constant higher than that of silicon oxide.

The gate spacer 120 may be disposed on sides of the transfer gate TG and the switching gate SWG. The gate spacer 120 may include at least one of silicon nitride, silicon oxynitride, silicon carbonitride (SiCN), silicon oxycarbonitride (SiOCN), silicon boron nitride (SiBN), silicon oxyboron nitride (SiOBN), silicon oxycarbide (SiOC) or their combination. The gate spacer 120 may be omitted.

Although not shown, the reset transistor RST, the source follower transistor SFT, and the selection transistor SLT may also include the gate insulating layer 110 and the gate spacer 120 illustrated in FIG. 11 like the transmission transistor TST or the switching transistor SWT. In addition, like the switching transistor SWT, these transistors may include a first source/drain area on one side and a second source/drain area on the other side based on the reset gate RG, the source follower gate SFG and the selection gate SG.

A first interlayer insulating layer 130 may be disposed on the transfer gate TG and the switching gate SWG. A first wiring layer WR1 may be disposed on the first interlayer insulating layer 130. A second interlayer insulating layer 140 may be disposed on the first wiring layer WR1. A second wiring layer WR2 may be disposed on the second interlayer insulating layer 140.

The first interlayer insulating layer 130 and the second interlayer insulating layer 140 may include at least one of silicon oxide, silicon nitride, silicon oxynitride, a low-k material, or their combination. The first interlayer insulating layer 130 and the second interlayer insulating layer 140 may be made of the same material but may be made of respective materials different from each other. The first interlayer insulating layer 130 and the second interlayer insulating layer 140 may have the same dielectric constant but may have respective dielectric constants different from each other. In detail, the second interlayer insulating layer 140 may serve as a dielectric layer of the first capacitor C1 and the second capacitor C2. In this respect, the second interlayer insulating layer 140 may be made of a material having a dielectric constant higher than that of the first interlayer insulating layer 130, but the applicable embodiment is not limited thereto.

Each of the first and second wiring layers WR1 and WR2 may be made of metal. For example, each of the first and second wiring layers WR1 and WR2 may include aluminum (Al), copper (Cu), silver (Ag), titanium (Ti), molybdenum (Mo), nickel (Ni), tungsten (W), cobalt (Co), ruthenium (Ru), or their alloy. The first and second wiring layers WR1 and WR2 may include the same material or may include different materials. Each of the first and second wiring layers WR1 and WR2 may be a single layer or may be a multi-layer in which a plurality of conductive layers are stacked.

Each of the first and second wiring layers WR1 and WR2 may include a plurality of conductive patterns.

The first wiring layer WR1 may include a first conductive pattern WR1_1, a second conductive pattern WR1_2, a third conductive pattern WR1_3, a fourth conductive pattern WR1_4, and a fifth conductive pattern WR1_5.

The first conductive pattern WR1_1 may be one electrode of the first capacitor C1 or may be connected thereto. The first conductive pattern WR1_1 may be also connected to the floating diffusion region FD through a contact hole that passes through the first interlayer insulating layer 130.

The second conductive pattern WR1_2 may be one electrode of the second capacitor C2 or may be connected thereto. The second conductive pattern WR1_2 may be also connected to the first source/drain area AR_SD1 of the switching transistor SWT through a contact hole that passes through the first interlayer insulating layer 130.

The third conductive pattern WR1_3 may be connected to the transmission line. The third conductive pattern WR1_3 may be also connected to the transfer gate TG through a contact hole that passes through the first interlayer insulating layer 130.

The fourth conductive pattern WR1_4 may be connected to a switching control line. The fourth conductive pattern WR1_4 may be also connected to the switching gate SWG through a contact hole that passes through the first interlayer insulating layer 130.

The fifth conductive pattern WR1_5 may be connected to the floating diffusion region FD and the second source/drain area AR_SD2 of the switching transistor SWT through contact holes that pass through the first interlayer insulating layer 130. That is, the floating diffusion region FD and the second source/drain area AR_SD2 of the switching transistor SWT may be electrically connected to each other through the fifth conductive pattern WR1_5.

Unlike the shown example, the fifth conductive pattern WR1_5 may be omitted, and the floating diffusion region FD and the second source/drain area AR_SD2 of the switching transistor SWT may be integrally formed.

The second wiring layer WR2 may include a sixth conductive pattern WR2_1 and a seventh conductive pattern WR2_2.

The sixth conductive pattern WR2_1 may be connected to the third power line. The sixth conductive pattern WR2_1 may be the other electrode of the first capacitor C1 or may be connected thereto. In one embodiment, the sixth conductive pattern WR2_1 may overlap the first conductive pattern WR1_1 in the third direction Z but is not limited thereto. The sixth conductive pattern WR2_1 may not overlap the first conductive pattern WR1_1 in the third direction Z, but may be positioned to be close to each other, whereby a predetermined capacitance may be formed.

The seventh conductive pattern WR2_2 may be connected to the boosting line. The seventh conductive pattern WR2_2 may be the other electrode of the second capacitor C2 or may be connected thereto. In one embodiment, the seventh conductive pattern WR2_2 may overlap the second conductive pattern WR1_2 in the third direction Z but is not limited thereto. The seventh conductive pattern WR2_2 may not overlap the second conductive pattern WR1_2 in the third direction Z, but may be positioned to be close to each other, whereby a predetermined capacitance may be formed.

In some embodiments, the image sensor 10 may further include a color filter 170, a micro lens 180, a grid pattern 160, and a passivation layer 150, which are disposed on the second surface 100b of the substrate 100.

In detail, the passivation layer 150 may be disposed on the second surface 100b of the substrate 100. The passivation layer 150 may include, for example, a high-k material. The passivation layer 150 may include an amorphous crystalline structure.

The passivation layer 150 is illustrated as being formed of a single layer but is not limited thereto. In some other embodiments, the passivation layer 150 may further include a planarization layer and/or an anti-reflective layer. In this case, the planarization layer may include at least one of a silicon oxide-based material, a silicon nitride-based material, a resin, or their combination. The anti-reflective layer may include, but is not limited to, a high-k material, e.g., hafnium oxide ($HfO_2$).

The color filter 170 may be disposed on passivation layer 150. The color filter 170 may be arranged to correspond to each unit pixel PX. For example, the color filter 170 may be arranged on a plane defined by the first direction X and the second direction Y two-dimensionally (e.g., in the form of matrix).

The color filter 170 may include a red, green, or blue color filter disposed for each pixel PX. In addition, the color filter 170 may include a yellow filter, a magenta filter, and a cyan filter, and may further include a white filter.

The grid pattern 160 may be formed in a lattice shape on the second surface 100b of the second substrate 130 to surround each of the pixels PX. For example, the grid pattern 160 may be disposed between the color filters 170 on the passivation layer 150. The grid pattern 160 may reflect incident light obliquely incident thereon to provide more incident light to the photoelectric conversion area LEC.

The micro lens 180 may be disposed on the color filter 170. The micro lens 180 may be arranged to correspond to each pixel PX. In one embodiment, one micro lens 180 may be disposed on one color filter 170.

The micro lens 180 may be disposed to cover the photoelectric conversion area LEC. The micro lens 180 may have a convex surface to condense the incident light into the photoelectric conversion area LEC. The micro lens 180 may include, but is not limited to, a photoresist material or a thermosetting resin.

Hereinafter, other embodiments will be described. In the following embodiments, the same reference numerals are given to the same elements as those already described, and a repeated description will be omitted or simplified.

Figure 12:
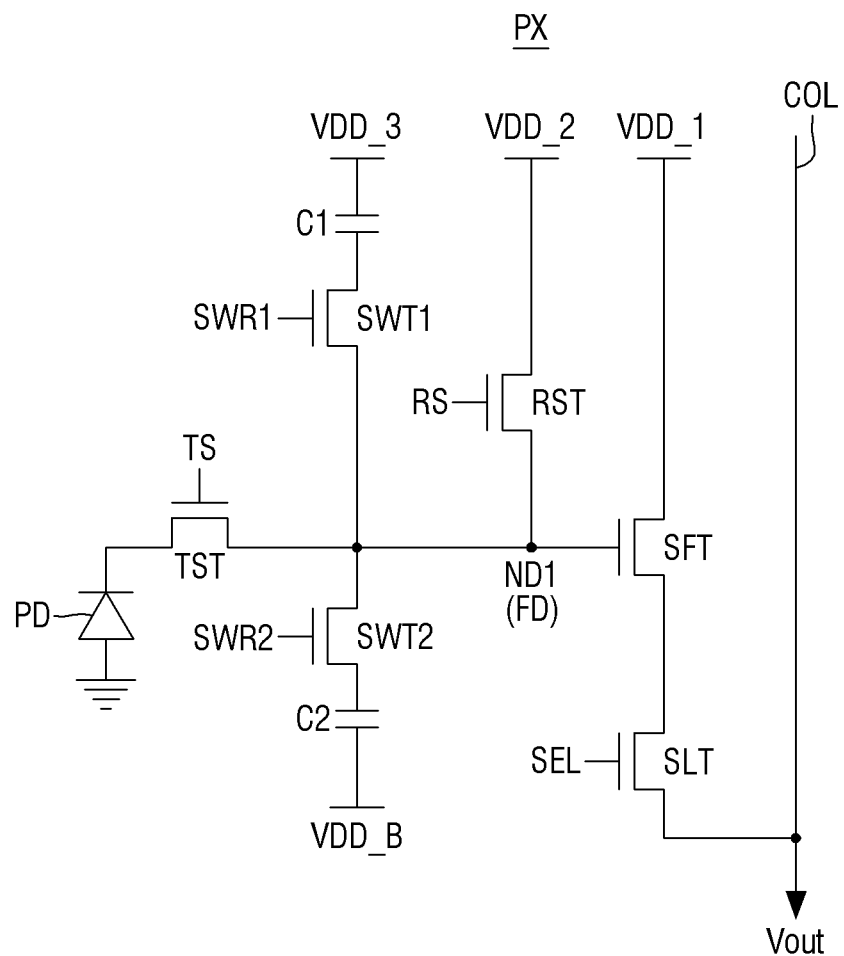
FIG. 12 is a circuit view illustrating one pixel according to another embodiment.
Figure 13:
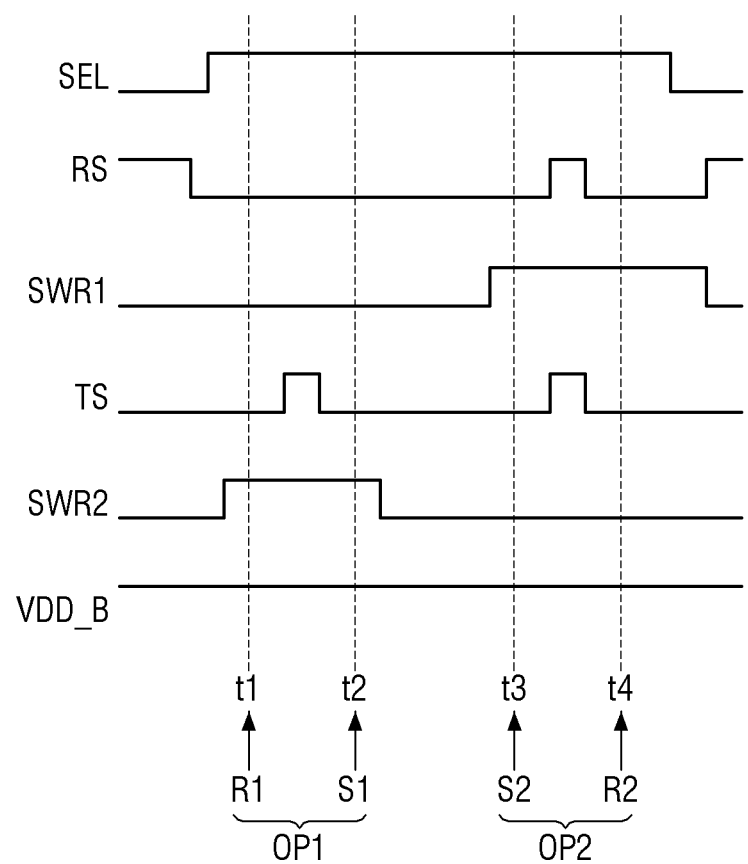
FIG. 13 is an exemplary timing view illustrating an operation of one pixel having a circuit structure of FIG. 12.

FIG. 12 is a circuit view illustrating one pixel according to another embodiment. FIG. 13 is an exemplary timing view illustrating an operation of one pixel having a circuit structure of FIG. 12.

Referring to FIGS. 12 and 13, the pixel circuit according to the present embodiment is different from the embodiment of FIGS. 5 and 6 in that the switching transistor SWT2 is further connected between the second capacitor C2 and the first node ND1, and the second capacitor C2 is connected to a boost power line providing a boost power voltage VDD_B.

In order to distinguish a plurality of switching transistors from each other, the switching transistor connected to the first capacitor C1 will be referred to as a first switching transistor SWT1, and the switching transistor connected to the second capacitor C2 will be referred to as a second switching transistor SWT2.

The first switching transistor SWT1 may connect the first capacitor C1 with the first node ND1 in response to a first switching control signal SWR1 applied to the corresponding row. The second switching transistor SWT2 may connect the second capacitor C2 with the first node ND1 in response to a second switching control signal SWR2 applied to the corresponding row. The second switching control signal SWR2 may be a signal different from the first switching control signal SWR1. The first switching control signal SWR1 and the second switching control signal SWR2 have a high level at different times and may turn on the first switching transistor SWT1 and the second switching transistor SWT2 at different times.

The boost power voltage VDD_B applied to the other electrode of the second capacitor C2 may be a reference voltage (e.g., DC voltage) that does not swing unlike the boosting signal FDB of FIG. 5 but is not limited thereto. The boost power line may be a common line connected to all pixels PX to transfer the same voltage to all pixels PX. In one embodiment, the boost power line may be connected to at least one of the first power line, the second power line, or the third power line.

As shown in FIG. 13, the boost power voltage VDD_B may have a constant voltage level regardless of an operating state.

The second switching control signal SWR2 may have substantially the same signal waveform as the boosting signal FDB of FIG. 6. In detail, the second switching control signal SWR2 may be switched from a low level to a high level before the first time t1 and may be switched to a low level again at the time period between the second time t2 and the third time t3. While the second switching control signal SWR2 is maintaining a high level, the second switching transistor SWT2 is turned on, so that the boost power voltage VDD_B may be provided to the first node ND1. As a result, the potential of the first node ND1 (i.e., floating diffusion region FD) may be increased as described in FIG. 6. Therefore, the transmission efficiency of the photodiode PD may be increased to minimize charges remaining in the photodiode PD, whereby the image may be more exactly sensed.

Figure 14:
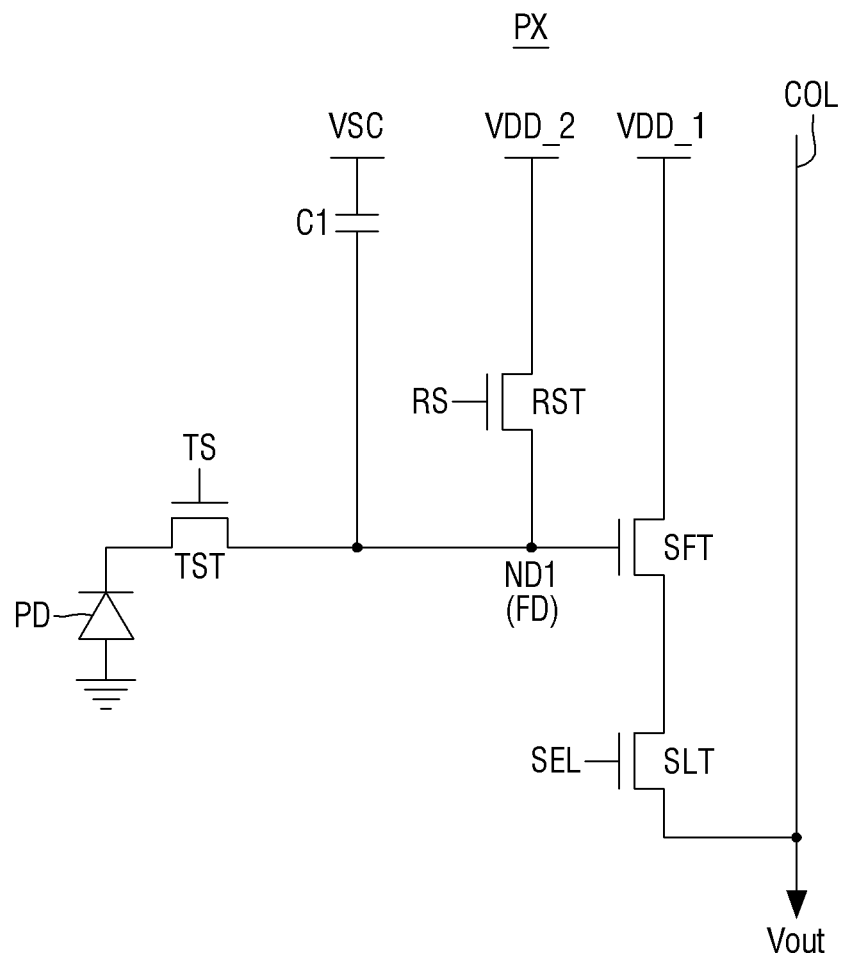
FIG. 14 is a circuit view illustrating one pixel according to another embodiment.
Figure 15:
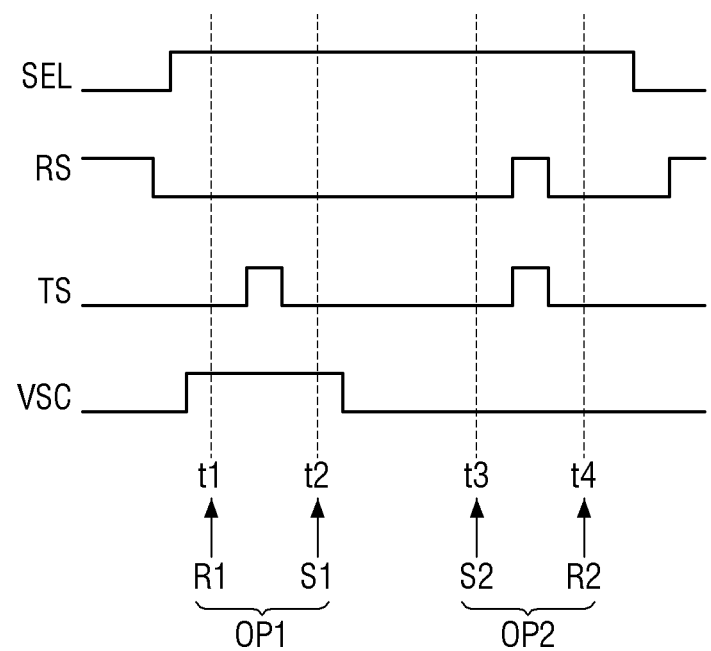
FIG. 15 is an exemplary timing view illustrating an operation of one pixel having the circuit structure of FIG. 14.

FIG. 14 is a circuit view illustrating one pixel according to another embodiment. FIG. 15 is an exemplary timing view illustrating an operation of one pixel having the circuit structure of FIG. 14.

Referring to FIGS. 14 and 15, the pixel circuit according to the present embodiment is different from the embodiment of FIGS. 5 and 6 in that the switching transistor ('SWT' of FIG. 5) and the second capacitor ('C2' of FIG. 5) are omitted, and a capacitor power line for transferring a capacitor voltage signal VSC not the third power voltage ('VDD_3' of FIG. 5) is connected to the first capacitor C1.

In detail, the capacitor voltage signal VSC is a signal for swinging a high level and a low level, and is provided separately for each row.

The capacitor voltage signal VSC may have substantially the same signal waveform as the boosting signal FDB of FIG. 6, as shown in FIG. 15. That is, the capacitor voltage signal VSC may be switched from a low level to a high level before the first time t1 and may be switched to a low level again at a time period between the second time t2 and the third time t3.

The low level of the capacitor voltage signal VSC may correspond to the third power voltage VDD_3 of FIG. 5. In one embodiment, the low level of the capacitor voltage signal VSC may be the same as the first power voltage VDD_1 and the second power voltage VDD_2, and the high level thereof may be greater than the first power voltage VDD_1 and the second power voltage VDD_2.

While the capacitor voltage signal VSC is maintaining a high level, the potential of the first node ND1 may be increased as much as a difference between a high level and a low level of the capacitor voltage signal VSC. Therefore, transmission efficiency of the photodiode PD may be increased to minimize the charges remaining in the photodiode PD, whereby the image may be sensed more exactly.

Meanwhile, since the capacitor voltage signal VSC maintains a low level in the second operation OP2 of the present embodiment, the potential of the first node ND1 may return to its original potential. Therefore, the second operation OP2 of the present embodiment may be performed substantially in the same manner as the second operation OP2 of FIG. 6.

Figure 16:
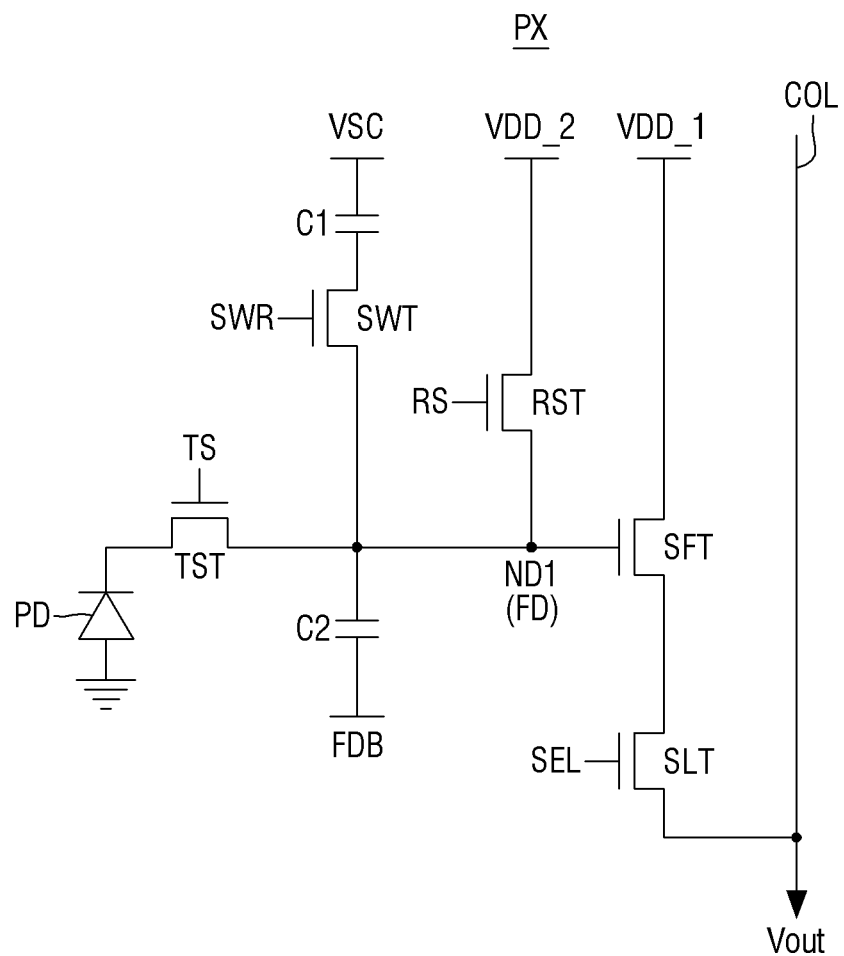
FIG. 16 is a circuit view illustrating one pixel according to another embodiment.
Figure 17:
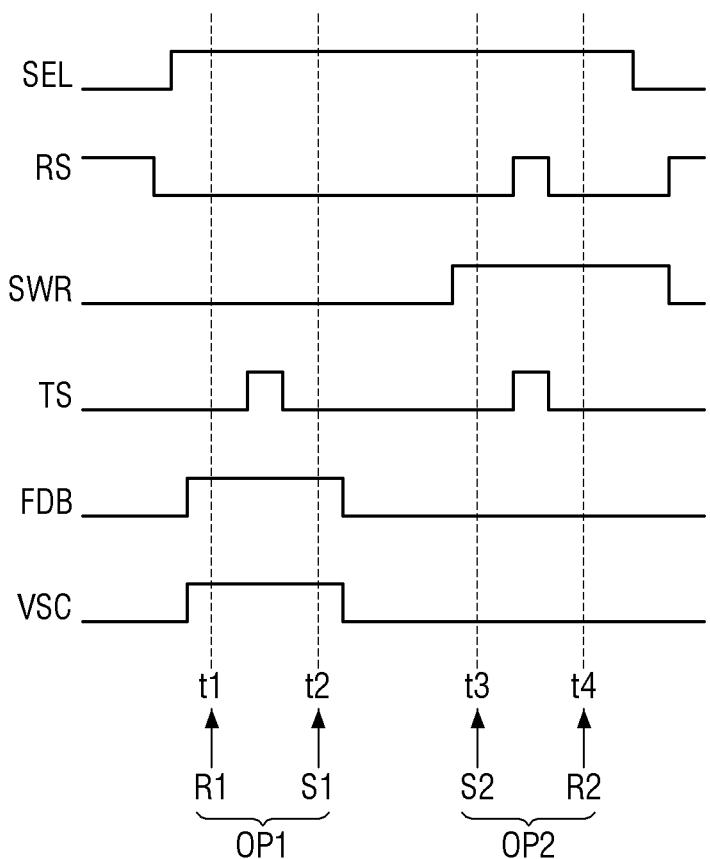
FIG. 17 is an exemplary timing view illustrating an operation of one pixel having the circuit structure of FIG. 16.

FIG. 16 is a circuit view illustrating one pixel according to another embodiment. FIG. 17 is an exemplary timing view illustrating an operation of one pixel having the circuit structure of FIG. 16.

Referring to FIGS. 16 and 17, the pixel circuit according to the present embodiment is different from the embodiment of FIGS. 5 and 6 in that the first capacitor C1 is connected to the capacitor voltage signal VSC not the third power voltage VDD_3.

The capacitor voltage signal VSC swings between a high level and a low level similarly to the embodiment of FIG. 14 and is provided separately for each row.

As shown in FIG. 17, the capacitor voltage signal VSC may have substantially the same or similar signal waveform as or to the boosting signal FDB. The high-level period of the capacitor voltage signal VSC and a high-level period of the boosting signal FDB may at least partially overlap each other.

In the present embodiment, while the second capacitor C2 increases the potential of the first node ND1 while maintaining a high level, the capacitor voltage signal VSC may also increase the potential of the first node ND1 while maintaining a high level. Therefore, since the potential of the first node ND1 may be further increased while the first operation OP1 is being performed, transmission efficiency of the photodiode PD may be increased to minimize charges remaining in the photodiode PD.

Figure 18:
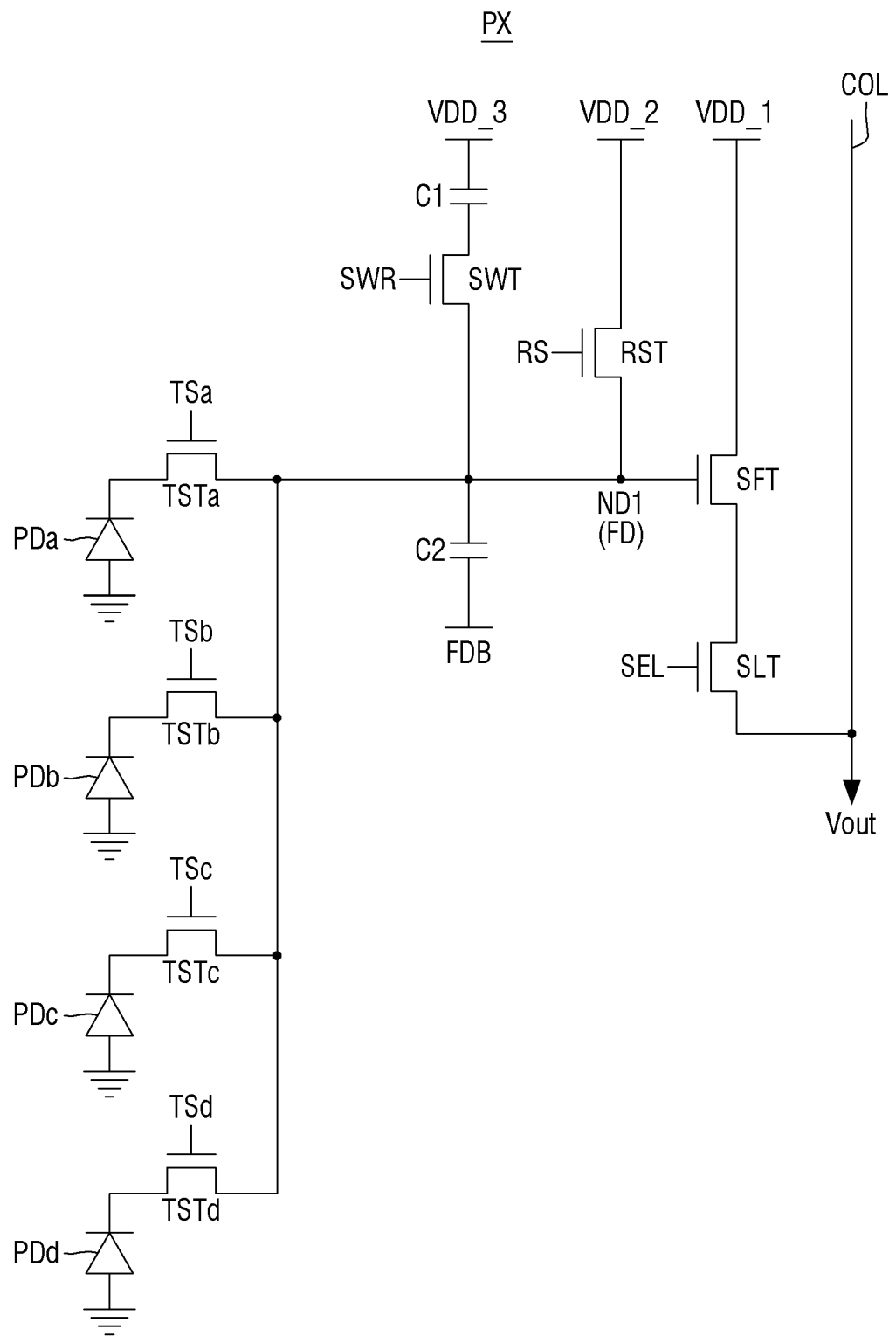
FIG. 18 is a circuit view illustrating one pixel according to another embodiment.

FIG. 18 is a circuit view illustrating one pixel according to another embodiment.

In the embodiment of FIG. 18, the pixel includes a plurality of photodiodes PDa, PDb, PDc and PDd, and a respectively connected to the photodiodes PDa, PDb, PDc and PDd. The plurality of transmission transistors TSTa, TSTb, TSTc and TSTd may all be connected to the first node ND1. In FIG. 18, although one pixel includes four photodiodes PDa, PDb, PDc and PDd and four transmission transistors TSTa, TSTb, TSTc and TSTd, various modifications may be made in the number of photodiodes and transmission transistors.

Different transmission signals TSa, TSb, TSc and TSd may be applied to the respective transmission transistors TSTa, TSTb, TSTc and TSTd, but the present disclosure is not limited thereto. The same transmission signal may be applied to the respective transmission transistors TSTa, TSTb, TSTc and TSTd.

When different transmission signals TSa, TSb, TSc and TSd are applied to the respective transmission transistors TSTa, TSTb, TSTc and TSTd, the pixel may output charges generated in the respective photodiodes PDa, PDb, PDc and PDd through a plurality of operations. When the boosting signal FDB is maintained at a high level while each of the transmission transistors TSTa, TSTb, TSTc and TSTd is turned on, the potential of the first node N1 may be increased, whereby transmission efficiency of the photodiodes PDa, PDb, PDc and PDd may be increased.

Figure 19:
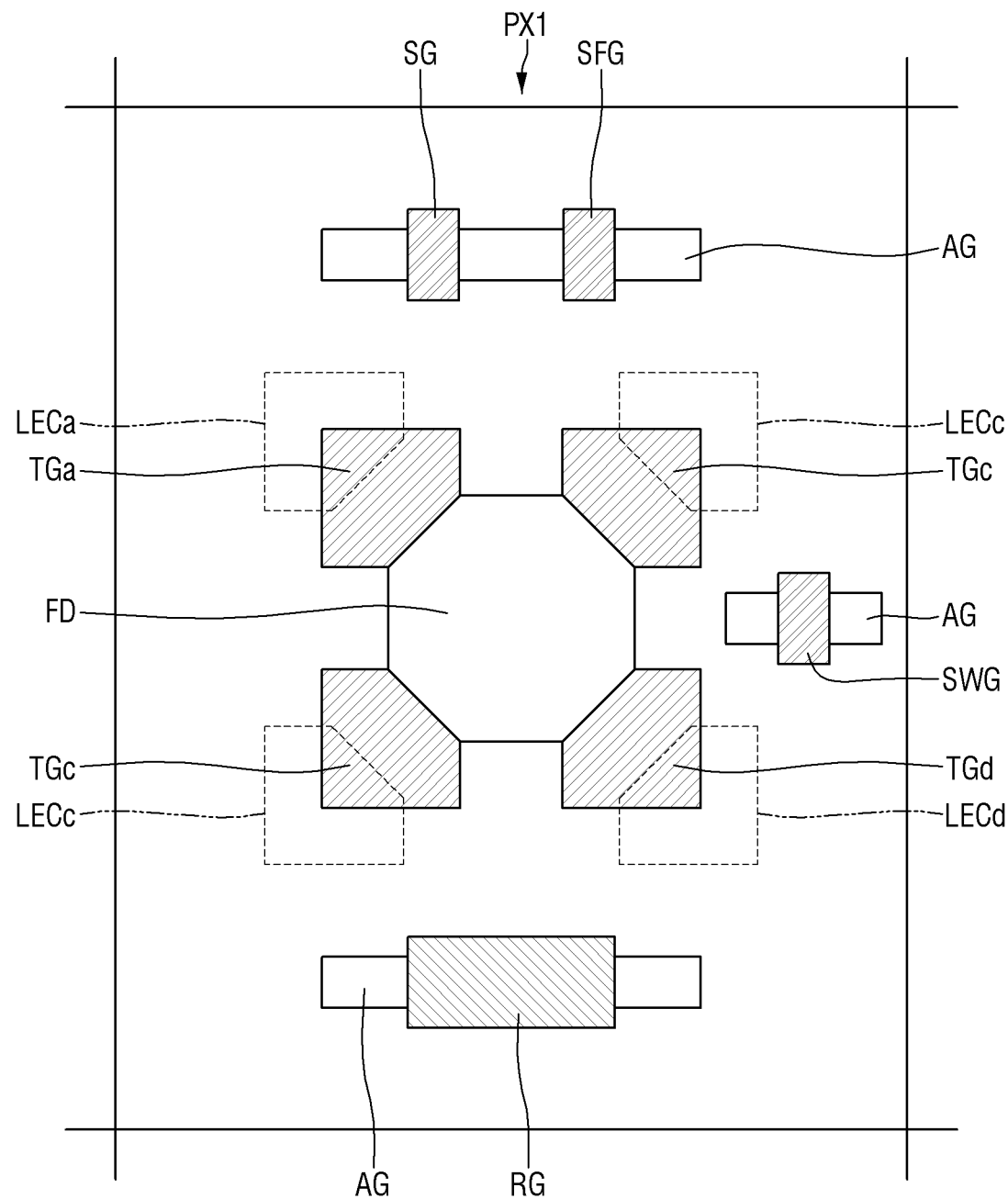
FIG. 19 is an exemplary schematic layout view illustrating a pixel having the circuit structure of FIG. 18.

FIG. 19 is an exemplary schematic layout view illustrating a pixel having the circuit structure of FIG. 18.

Referring to FIG. 19, a photoelectric conversion area LECa corresponding to a photodiode PDa, a photoelectric conversion area LECb corresponding to a photodiode PDb, a photoelectric conversion area LECc corresponding to a photodiode PDc, and a photoelectric conversion area LECd corresponding to a photodiode PDd are separated from and spaced apart from one another. The transfer gates TGa, TGb, TGc and TGd may be separated from one another to be spaced apart from one another, and may at least partially overlap the corresponding photodiodes PDa, PDb, PDc and PDd.

The floating diffusion region FD is surrounded by each of the transfer gates TGa, TGb, TGc and TGd. Through this layout, the respective transmission transistors TSTa, TSTb, TSTc and TSTd may share one integrated floating diffusion region FD.

Figure 20:
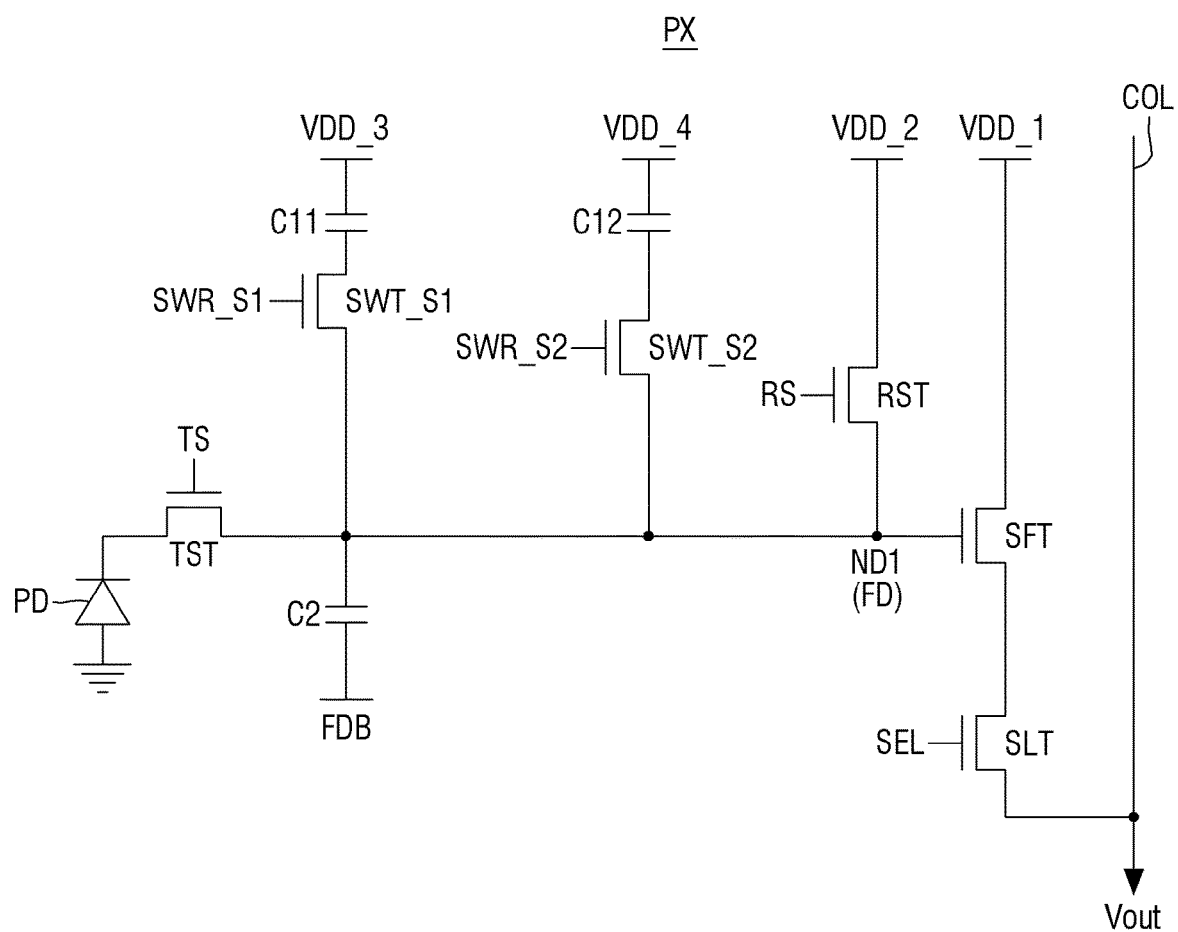
FIG. 20 is an exemplary circuit view illustrating one pixel according to another embodiment.

FIG. 20 is a circuit view illustrating one pixel according to another embodiment.

In the pixel circuit of the embodiment of FIG. 20, a plurality of storage capacitors are connected to the first node ND1. Although two storage capacitors are illustrated in FIG. 20, the number of storage capacitors may be modified.

Referring to FIG. 20, the first capacitor C1 may include a first sub-capacitor C11 and a second sub-capacitor C12. The switching transistor SWT may include a first sub-switching transistor SWT_S1 for controlling connection between the first sub-capacitor C11 and the first node ND1, and a second sub-switching transistor SWT_S2 controlling connection between the second sub-capacitor C12 and the first node ND1.

The first sub-capacitor C11 may be connected between the first sub-switching transistor SWT_S1 and the third power line, and the second sub-capacitor C12 may be connected between the second sub-switching transistor SWT_S2 and a fourth power line. The third power line may supply the third power voltage VDD_3, and the fourth power line may supply a fourth power voltage VDD_4. The third power voltage VDD_3 and the fourth power voltage VDD_4 may be the same voltage but may be voltages different from each other.

A gate of the first sub-switching transistor SWT_S1 may receive a first sub-switching control signal SWR_S1, and a gate of the second sub-switching transistor SWT_S2 may receive a second sub-switching control signal SWR_S2.

In the present embodiment, the first sub-capacitor C11 and the second sub-capacitor C12 may be separated from the first node ND1 while the high-level boosting signal FDB is being applied to the second capacitor C2 through the first sub-switching transistor SWT_S1 and the second sub-switching transistor SWT_S2. Further, as the first sub-switching transistor SWT_S1 and the second sub-switching transistor SWT_S2 are independently driven, charges accumulated in the first sub-capacitor C11 and the second sub-capacitor C12 may be separately output through different operations.

As a modified example of the present embodiment, the same switching control signal may be applied to the gate of the first sub-switching transistor SWT_S1 and the gate of the second sub-switching transistor SWT_S2.

The technical spirits described through the above-described embodiments are applicable to embodiments in which one pixel PX includes a plurality of subpixels. Each of the plurality of subpixels included in one pixel PX may include a separate photoelectric conversion area LEC, a transmission transistor TST, and a floating diffusion region FD. Each subpixel may be distinguished from the pixel of the embodiment of FIGS. 18 and 19 in which a plurality of photodiodes share one floating diffusion region FD in that each subpixel has an independent floating diffusion region FD. Hereinafter, embodiments in which pixels include a plurality of subpixels will be described in detail.

Figure 21:
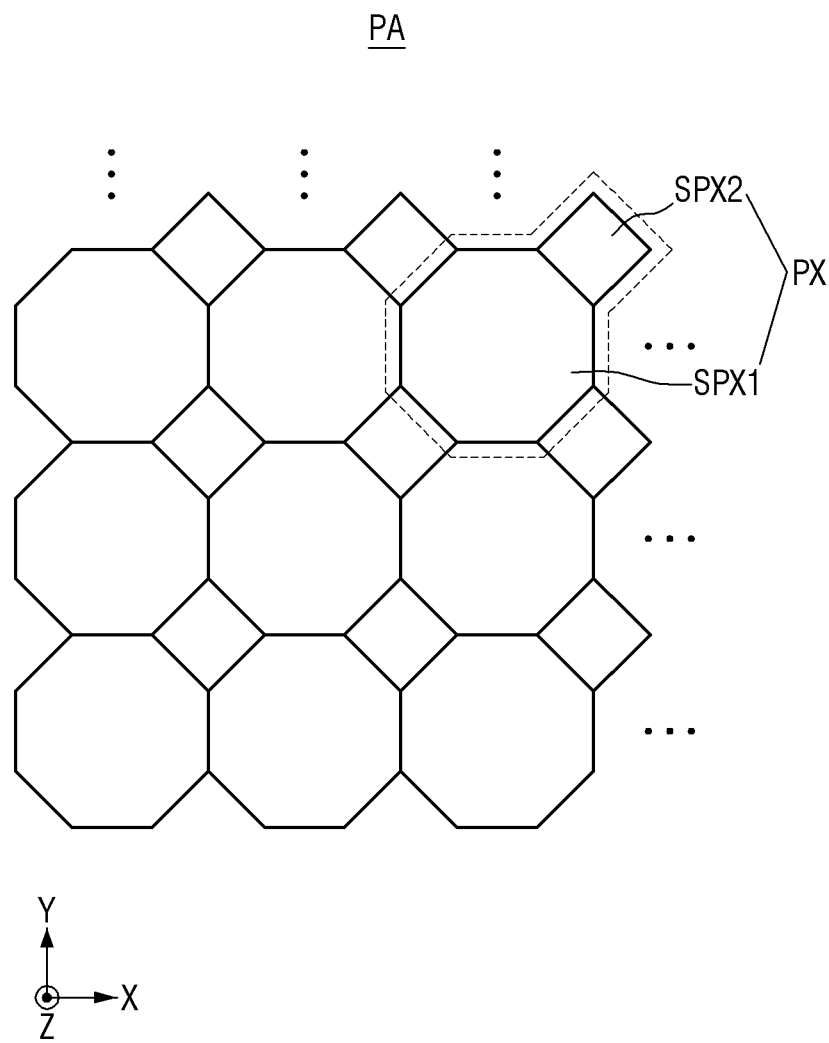
FIG. 21 is a partial layout view illustrating a pixel of an image sensor according to some embodiments.

FIG. 21 is a partial layout view illustrating a pixel of an image sensor according to some embodiments.

Referring to FIG. 21, a pixel PX may include a first subpixel SPX1 and a second subpixel SPX2. The first subpixel SPX1 has an area wider than the second subpixel SPX2. As described below, the first subpixel SPX1 includes a first photoelectric conversion area LEC1, the second subpixel SPX2 includes a second photoelectric conversion area LEC2, wherein the first photoelectric conversion area LEC1 may have an area wider than that of the second photoelectric conversion area LEC2 on a plan view. The first subpixel SPX1 may include a first floating diffusion region, and the second subpixel SPX2 may include a second floating diffusion region.

In one embodiment, the first subpixel SPX1 may have an octagonal shape, and the second subpixel SPX2 may have a rectangular shape. The second subpixel SPX2 may be disposed to be adjacent to one of the eight sides of the first subpixel SPX1. One side of the first subpixel SPX1 and one side of the second subpixel SPX2 may be in contact with each other but are not limited thereto.

Figure 22:
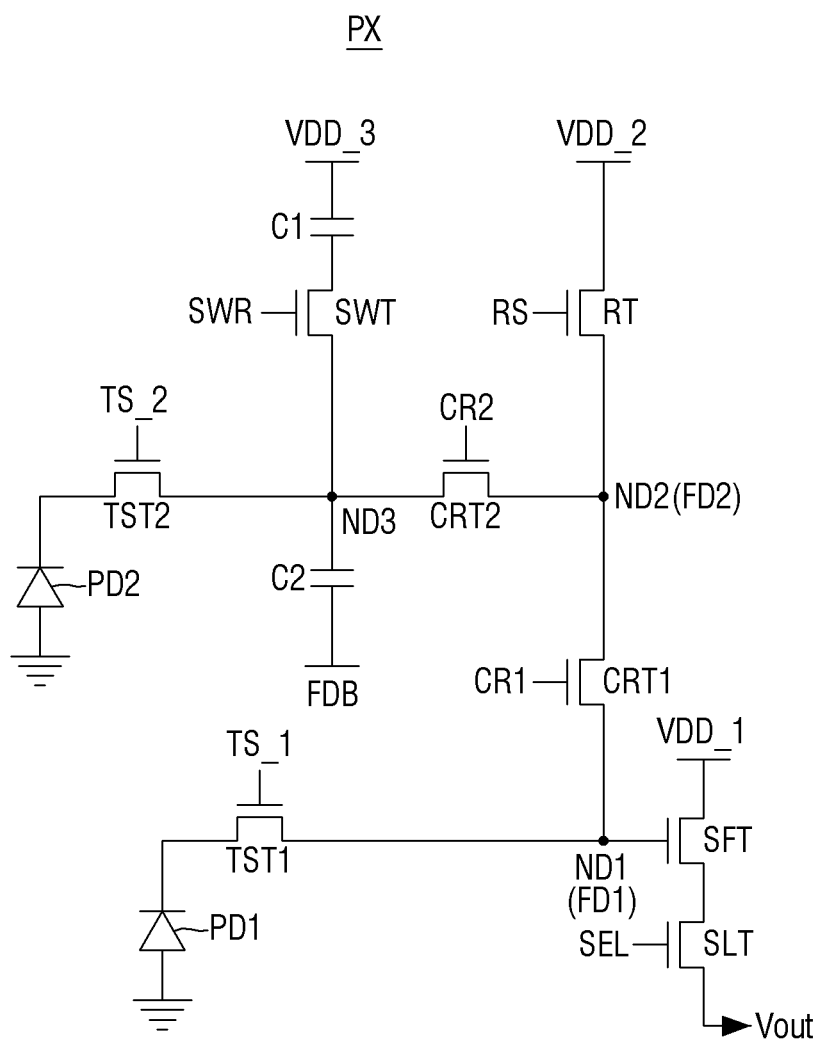
FIG. 22 is an exemplary circuit view illustrating one pixel of FIG. 21.

FIG. 22 is a circuit view illustrating one pixel of FIG. 21.

Referring to FIG. 22, the pixel circuit may include a first photodiode PD1, a second photodiode PD2, a plurality of transistors, a first capacitor C1, and a second capacitor C2.

The plurality of transistors may include a transmission transistor TST, a source follower transistor SFT, a selection transistor SLT, a reset transistor RST, a switching transistor SWT, a first connection transistor CRT1, and a second connection transistor CRT2. The transmission transistor TST may include a first transmission transistor TST1 and a second transmission transistor TST2.

The first subpixel SPX1 may include a first photodiode PD1 and a first transmission transistor TST1 and may have a first floating diffusion region FD1, and the second subpixel SPX2 may include a second photodiode PD2 and a second transmission transistor TST2 and may have a second floating diffusion region FD2.

The first photodiode PD1 may correspond to the first photoelectric conversion area LEC1, and the second photodiode PD2 may correspond to the second photoelectric conversion area LEC2. The first photodiode PD1 that includes the first photoelectric conversion area LEC1 having a relatively large area on a plan view may be referred to as a large photodiode, and the second photodiode PD2 that includes a relatively small second photoelectric conversion area LEC2 may be referred to as a small photodiode.

The first subpixel SPX1 and the second subpixel SPX2 may share one source follower transistor SFT, one selection transistor SLT, and one reset transistor RST.

In more detail, the first transmission transistor TST1 is disposed between the first photodiode PD1 and the first node ND1. The first node ND1 may be connected to the first floating diffusion region FD1, or itself may be a first floating diffusion region FD1. The gate of the first transmission transistor TST1 may be connected to the first transmission line to receive the first transmission signal TS_1.

The source follower transistor SFT is connected between the first power line providing the first power voltage VDD_1 and the output signal line COL of the corresponding column. The gate of the source follower transistor SFT is connected to a first node ND1 connected to the first floating diffusion region.

The selection transistor SLT is disposed between the source follower transistor SFT and the output signal line COL. The gate of the selection transistor SLT may be connected to the selection line of the corresponding row to receive the selection signal SEL.

A first connection transistor CRT1 and a reset transistor RST are disposed between the first node ND1 and the second power line VDD_2 providing the second power voltage VDD_2. A second node ND2 is defined between the first connection transistor CRT1 and the reset transistor RST.

The first connection transistor CRT1 is disposed between the first node ND1 and the second node ND2. The gate of the first connection transistor CRT1 is connected to a connection signal line. The first connection transistor CRT1 may connect the first node ND1 with the second node ND2 in accordance with the first connection control signal CR1 provided from the first connection signal line.

The reset transistor RST is disposed between the second power line providing the second power voltage VDD_2 and the second node ND2. The gate of the reset transistor RST may be connected to the reset line to receive the reset signal RS.

A second transmission transistor TST2 and a second connection transistor CRT2 are disposed between the second photodiode PD2 and the second node ND2. A third node ND3 is defined between the second transmission transistor TST2 and the second connection transistor CRT2.

The second transmission transistor TST2 is connected between the second photodiode PD2 and the third node ND3. The third node ND3 may be connected to the second floating diffusion region FD2, or may be the second floating diffusion region FD2. The gate of the second transmission transistor TST2 may be connected to a second transmission line. A second transmission signal TS_2, which is a scan signal different from that of the first transmission line, may be applied to the second transmission line, whereby the first transmission transistor TST1 and the second transmission transistor TST2 may be turned on and off at different times.

The second connection transistor CRT2 is disposed between the third node ND3 and the second node ND2. The gate of the second connection transistor CRT2 is connected to the second connection signal line. The second connection transistor CRT2 may serve to connect the third node ND3 with the second node ND2 in accordance with the second connection control signal CR1 applied through the second connection signal line.

The switching transistor SWT is connected between the third node ND3 and the first capacitor C1. The gate of the switching transistor SWT is connected to the switching line of the corresponding row. The switching transistor SWT connects the third node ND3 with the first capacitor C1 in accordance with the switching control signal SWR input through the switching line.

The first capacitor C1 is disposed between the switching transistor SWT and the third power line supplying the third power voltage VDD_3. The first capacitor C1 may serve to store charges overflowed from the photodiode PD. That is, the first capacitor C1 may be a kind of the storage capacitor.

One electrode of the first capacitor C1 is connected to the source/drain area of the switching transistor SWT. The other electrode of the first capacitor C1 is connected to the third power line to receive the third power voltage VDD_3. The first capacitor C1 is connected to the third node ND3 through the switching transistor SWT.

The second capacitor C2 is connected between the third node ND3 and the boosting line. One electrode of the second capacitor C2 may be connected to the third node ND3, and the other electrode thereof may be connected to the boosting line of the corresponding row. The second capacitor C2 may serve to boost the potential of the third node ND3 in accordance with the boosting signal FDB transferred to the boosting line. That is, the second capacitor C2 may be a kind of the boosting capacitor.

Figure 23:
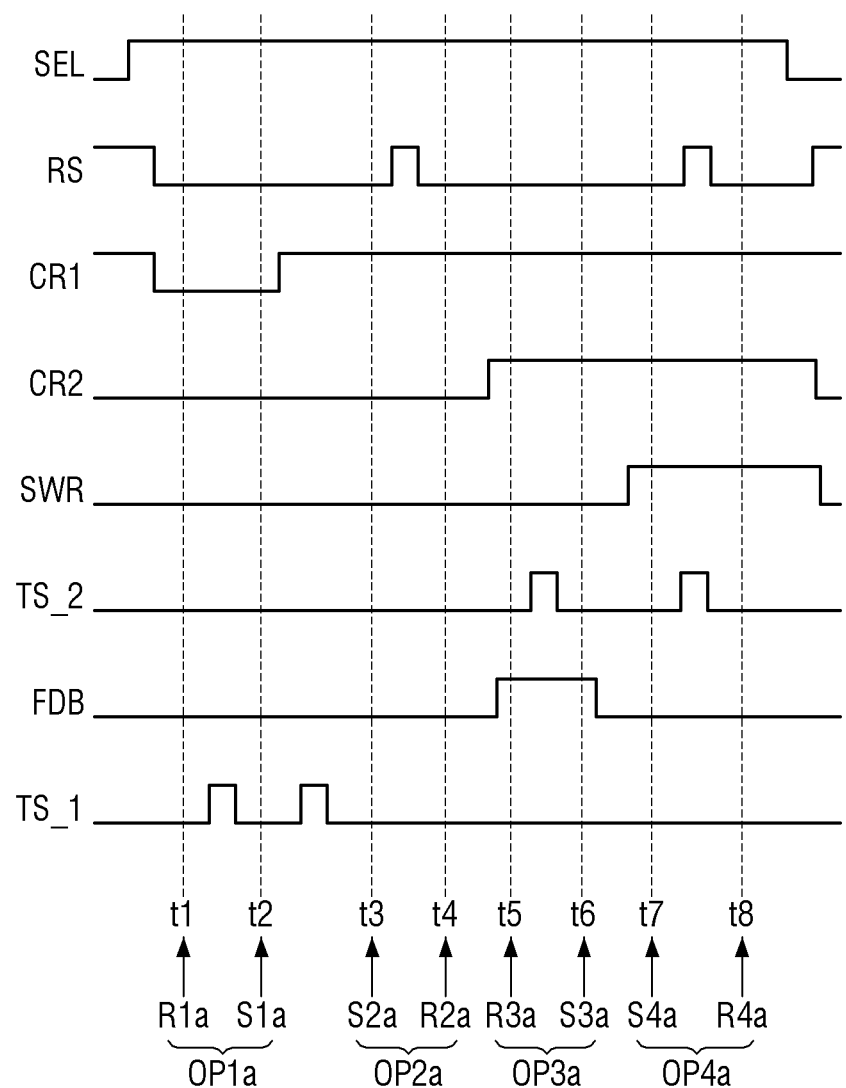
FIG. 23 is an exemplary timing view illustrating an operation of one pixel having the circuit structure of FIG. 22.

FIG. 23 is an exemplary timing view illustrating an operation of one pixel having the circuit structure of FIG. 22.

Referring to FIGS. 22 and 23, readout of the pixel PX may include four operations. In detail, the readout of the pixel PX may include a first operation OP1$a$, a second operation OP2$a$, a third operation OP3$a$, and a fourth operation OP4$a$, which are sequentially performed in a time order. Each operation includes one of signal operations S1$a$, S2$a$, S3$a$ and S4$a$, and may further include one of reset operations R1$a$, R2$a$, R3$a$ and R4$a$. The reset operation within one operation may be performed before the signal operation, or may be performed after the signal operation. In some operations, the reset operation may be omitted. During four operations, the selection signal SEL maintains a high level.

During the time before the readout, that is, during the time before the first operation OP1$a$, the selection signal SEL, the second connection control signal CR2, the switching control signal SWR, the second transmission signal TS_2, the boost control signal FDB, and the first transmission signal TS_1 maintain a low level, and the reset signal RS and the first connection control signal CR1 maintain a high level.

In the first operation OP1$a$, the first reset operation R1$a$ may be first performed at the first time t1, and then the first signal operation S1$a$ may be performed at the second time t2.

In detail, the selection signal SEL is switched from a low level to a high level, and the reset signal RS and the first connection control signal CR1 are switched from a high level to a low level, until the first time t1 at which the first reset operation R1$a$ is performed. The charges accumulated in the first node ND1 during the first reset operation R1$a$ may be converted into a first reset voltage VR1$a$ through the source follower transistor SFT and then output.

Subsequently, the first signal operation S1$a$ may be performed at the second time t2. During the time period between the first time t1 and the second time t2, the first transmission signal TS_1 may be switched from a low level to a high level and then switched to a low level. While the first transmission signal TS_1 is maintained at a high level, the first transmission transistor TST1 may be turned on for a predetermined time and then turned off. The first node ND1 may be connected to the first photodiode PD1 for a time when the first transmission transistor TST1 is turned on. As a result, charges stored in the first photodiode PD1 may be transferred to the first node ND1 (i.e., first floating diffusion region FD1). The charges transferred to the first node ND1 may be converted into the first signal voltage VS1$a$ by the source follower transistor SFT and then output.

Subsequently to the first operation OP1$a$, the second operation OP2$a$ is performed. In the second operation OP2$a$, the second signal operation S2$a$ may be first performed at the third time t3, and then the second reset operation R2$a$ may be performed at the fourth time t4.

In detail, during the time period between the second time t2 and the third time t3, the first connection control signal CR1 is switched from a low level to a high level to turn on the first connection transistor CRT1. As a result, the first node ND1 and the second node ND2 may be connected to each other.

In addition, during the time period between the second time t2 and the third time t3, the first transmission signal TS_1 may be switched from a low level to a high level and then switched to a low level in a state in which the first connection transistor CRT1 is turned on. The first node ND1 may be connected to the first photodiode PD1 and the second node ND2 during the time when the first connection transistor CRT1 and the first transmission transistor TST1 are turned on at the same time. Therefore, charges of the first photodiode PD1 and the second node ND2 may be transferred to the first node ND1 during the above time. The charges transferred to the first node ND1 may be converted into a second signal voltage VS2$a$ by the source follower transistor SFT and then output.

Subsequently, the second reset operation R2$a$ may be performed at the fourth time t4. The reset signal RS may be switched from a low level to a high level and then switched to a low level between the third time t3 and the fourth time t4. While the reset signal RS maintains a high level, the reset transistor RST is turned on, and the charges of the first node ND1 and the second node ND2 may be reset. The reset charges of the first node ND1 and the second node ND2 may be converted into the second reset voltage VS2$a$ by the source follower transistor SFT and then output.

Subsequently to the second operation OP2$a$, the third operation OP3$a$ is performed. In the third operation OP3$a$, the third reset operation R3$a$ may be first performed at a fifth time t5, and then the third signal operation S3$a$ may be performed at a sixth time t6.

In detail, during a time period between the fourth time t4 and the fifth time t5, the second connection control signal CR2 is switched from a low level to a high level to turn on the second connection transistor CRT2. As a result, the third node ND3 and the second node ND2 may be connected to each other. Since the first connection transistor CRT1 maintains a turn-on state, the first node ND1, the second node ND2, and the third node ND3 may be connected to one another.

In addition, during the above time period, the boosting signal FDB is switched from a low level to a high level. That is, the boosting signal FDB of a high level may be applied to one electrode of the second capacitor C2. Therefore, the potential of the third node ND3 connected to the other electrode of the second capacitor C2 may be increased.

During the third reset operation R3$a$, the charges accumulated in the first node ND1, the second node ND2 and the third node ND3 may be output to a third reset voltage VR3$a$ through the source follower transistor SFT.

Subsequently, the third signal operation S3$a$ may be performed at the sixth time t6. During a time period between the fifth time t5 and the sixth time t6, the second transmission signal TS_2 may be switched from a low level to a high level and then switched to a low level. While the second transmission signal TS_2 maintains a high level, the second transmission transistor TST2 may be turned on for a predetermined time and then turned off. The third node ND3 may be connected to the second photodiode PD2 during the time when the second transmission transistor TST2 is turned on. Therefore, the charges stored in the second photodiode PD2 may be transferred to the third node ND3 (i.e., second floating diffusion region FD2). The charges transferred to the third node ND3 may be converted into a third signal voltage VS3a by the source follower transistor SFT and then output. In this step, since the boosting signal FDB maintains a high level, the third node ND3 is in a state in which its potential is increased to correspond to the boosting signal FDB. As a result, transmission efficiency by the second transmission transistor TST2 may be increased as described with reference to FIGS. 6 to 10.

Subsequently to the third operation OP3a, the fourth operation OP4a is performed. In the fourth operation OP4a, after the fourth signal operation S4a is first performed at a seventh time t7 and the fourth reset operation R4a may be performed at an eighth time t8.

In detail, during a time period between the sixth time t6 and the seventh time t7, the boosting signal FDB is switched from a high level to a low level. Therefore, the potential of the third node ND3 may return to the state before it is raised by the boosting signal FDB. Further, the switching control signal SWR is switched from a low level to a high level to turn on the switching transistor SWT. As a result, the first capacitor C1 may be connected to the third node ND3. Therefore, the charges stored in the first capacitor C1 may be transferred to the third node ND3 during the above time period. The charges transferred to the third node ND3 may be converted into a fourth signal voltage VS4a by the source follower transistor SFT and then output.

Subsequently, the fourth reset operation R4a may be performed at the eighth time t8. The reset signal RS and the second transmission signal TS_2 may be switched from a low level to a high level and then switched to a low level between the seventh time t7 and the eighth time t8. While the reset signal RS and the second transmission signal TS_2 are maintained at a high level, the reset transistor RST and the second transmission transistor TST2 are turned on, so that the charges of the second photodiode PD2 and the third node ND3 may be reset. The reset charges of the second photodiode PD2 and the third node ND3 may be converted into a fourth reset voltage VS42a by the source follower transistor SFT and then output.

After the second operation OP2, the selection signal SEL and the switching control signal SWR may be switched from a high level to a low level, and the reset signal RS may be switched from a low level to a high level.

After the fourth operation OP4a, the selection signal SEL, the second connection control signal CR2, and the switching control signal SWR may be switched from a high level to a low level, and the reset signal RS may be switched from a low level to a high level.

Figure 24:
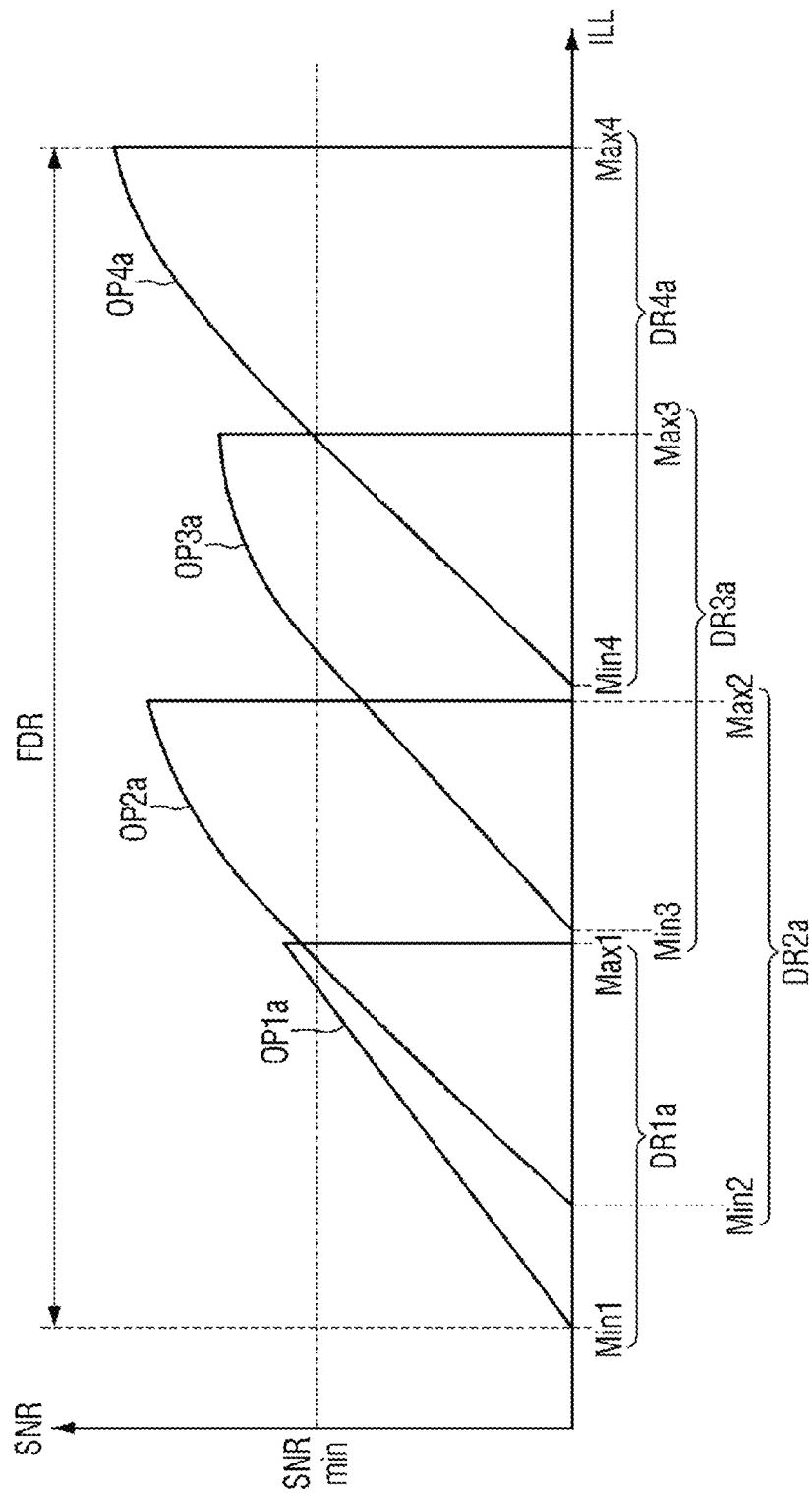
FIG. 24 is an exemplary graph illustrating a signal-to-noise ratio according to illuminance of a pixel by the pixel operation of FIG. 23.

FIG. 24 is a graph illustrating a signal-to-noise ratio (SNR) according to illuminance of a pixel (ILL) by the pixel operation of FIG. 23.

As shown in FIG. 24, the image sensor senses the minimum illuminance Min1, Min2, Min3, or Min4 and the maximum illuminance Max1, Max2, Max3, or Max4 during the operation of the pixel PX.

In the first operation OP1a that outputs charges generated from the first photodiode PD1 and transferred to the first node ND1, since the pixel PX has a relatively small capacitance, a first dynamic range DR1a of the first operation OP1a has a dynamic range of low illuminance. Therefore, the first operation OP1a may be useful for image sensing of a low illuminance environment.

Since the first node ND1 and the second node ND2 are connected to each other in the second operation OP2a, the pixel PX may have a larger capacitance than in the first operation OP1a. Therefore, a second dynamic range DR2a of the second operation OP2a has a value greater than that of the first dynamic range DR1a. The second dynamic range DR2a partially overlaps the first dynamic range DR1a, and the second operation OP2a indicating the second dynamic range DR2a may have a maximum signal-to-noise value SNR greater than that of the first operation OP1a indicating the first dynamic range DR1a.

The third operation OP3a is an operation of outputting the charges generated from the second photodiode PD2 and transferred to the third node ND3. In the third operation OP3a, since the first node ND1, the second node ND2 and the third node ND3 are connected to one another, a capacitance in the third operation OP3a may be larger than that in the second operation OP2a. Therefore, a third dynamic range DR3a of the third operation OP3a may have a value greater than that of the second dynamic range DR2a. The third dynamic range DR3a partially overlaps the second dynamic range DR2a, and the minimum illuminance Min3 may be greater than the maximum illuminance Max1 of the first dynamic range DR1a but is not limited thereto. In the drawing, the third operation OP3a representing the third dynamic range DR3a has a maximum signal-to-noise value SNR smaller than that of the second operation OP2a representing the second dynamic range DR2a, but the embodiment is not limited thereto.

In the same manner as the third operation OP3a, in the fourth operation OP4a, the first node ND1, the second node ND2, and the third node ND3 are connected together, and the first capacitor C1 is further connected to the third node ND3. Therefore, the fourth operation OP4a may have a capacitance larger than that of the third operation OP3a. As a result, a fourth dynamic range DR4a of the fourth operation OP4a may have a value greater than that of the third dynamic range DR3a. The fourth dynamic range DR4a partially overlaps the third dynamic range DR3a, and its minimum illuminance Min4 may be greater than the maximum illuminance Max2 of the second dynamic range DR2a but is not limited thereto. The fourth operation OP4a representing the fourth dynamic range DR4a may have a maximum signal-to-noise value SNR greater than that of the other operations.

As described above, when the pixel PX has a first photodiode PD1 and a second photodiode PD2, which have their respective sizes different from each other, a connection relation between the nodes may be diversified to set a dynamic range DR of various ranges. Therefore, since the pixel PX may output a signal having a full dynamic range that includes the first to fourth dynamic ranges DR1a, DR2a, DR3a and DR4a, a full-well capacity FDR of the image sensor may be increased. In addition, as the plurality of dynamic ranges are set to overlap, the output of a reference signal-to-noise ratio SNRmin, which is the minimum reference required in a wide illuminance range, may be obtained, whereby image sensing quality may be improved.

Figure 25:
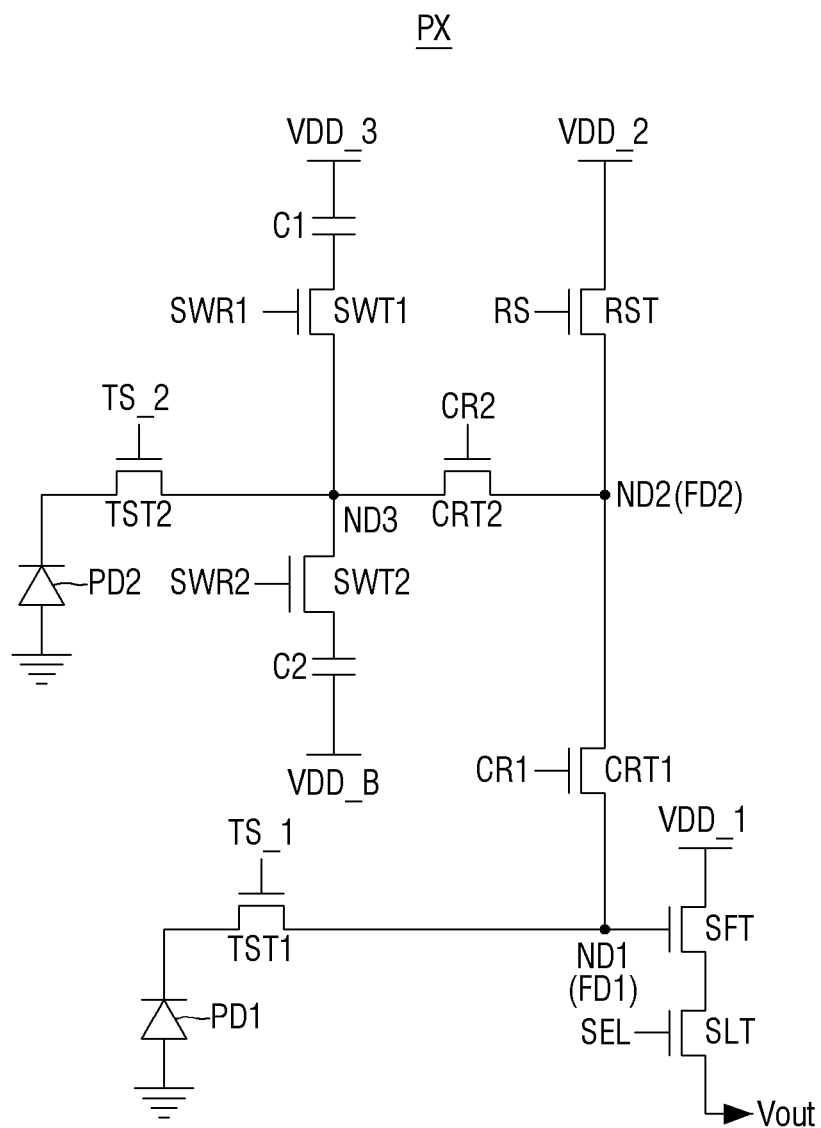
FIG. 25 is an exemplary circuit view illustrating one pixel according to another embodiment.
Figure 26:
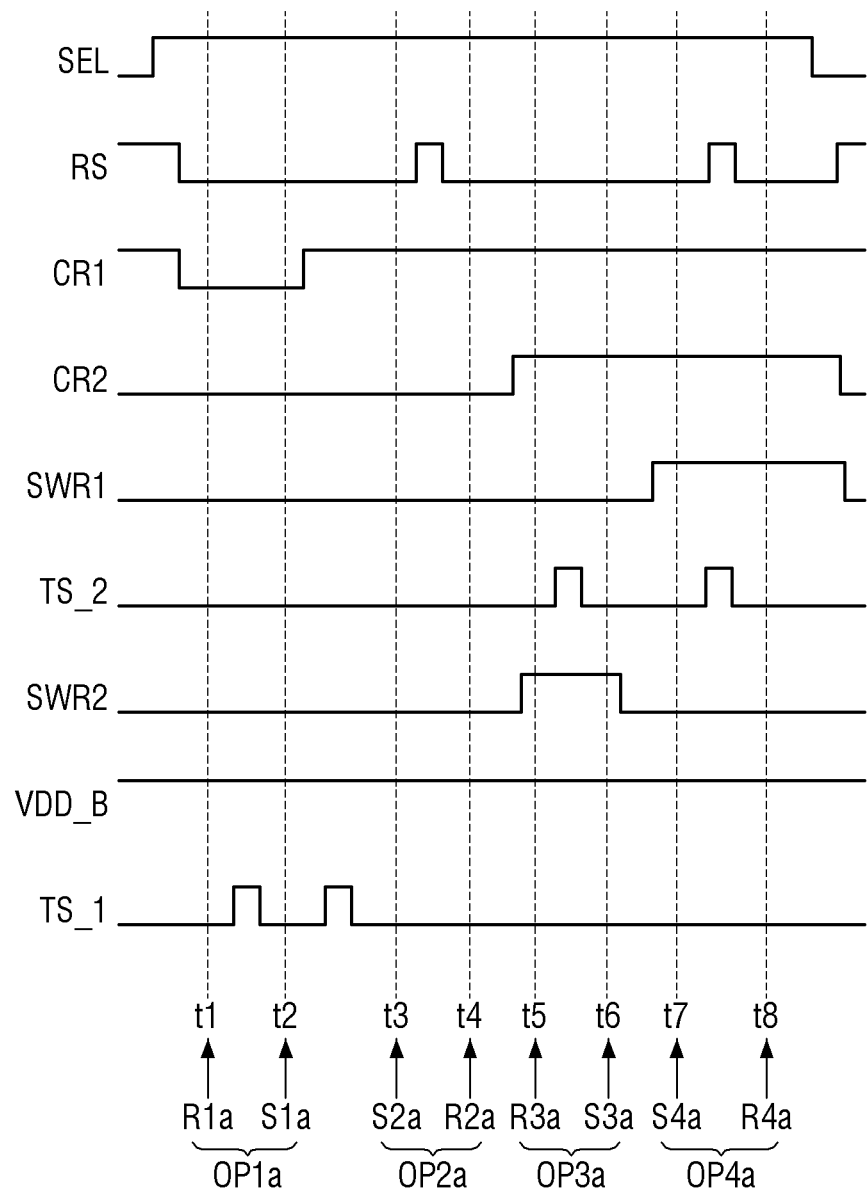
FIG. 26 is an exemplary timing view illustrating one pixel having the circuit structure of FIG. 25.

FIG. 25 is a circuit view illustrating one pixel according to another embodiment. FIG. 26 is an exemplary timing view illustrating one pixel having the circuit structure of FIG. 25.

According to the embodiment of FIGS. 25 and 26, even in the pixel that includes a plurality of subpixels, the second switching transistor SWT2 is further connected between the second capacitor C2 and the first node ND1 and the second capacitor C2 may be connected to a boost power line providing a boost power voltage VDD_B, as in the embodiment of FIGS. 12 and 13.

Since the basic configuration and operation of the present embodiment are substantially the same as those of FIGS. 22 and 23, and the second switching transistor SWT2 and the boost power line providing the boost power voltage VDD_B, and operations performed by the second switching transistor SWT2 and the boost power line are the same as those described with reference to the embodiment of FIGS. 12 and 13, their repeated description will be omitted.

In the present embodiment, transmission efficiency of the second photodiode PD2 may be increased to minimize the charges remaining in the second photodiode PD2, and the full-well capacity FDR of the image sensor may be increased.

Figure 27:
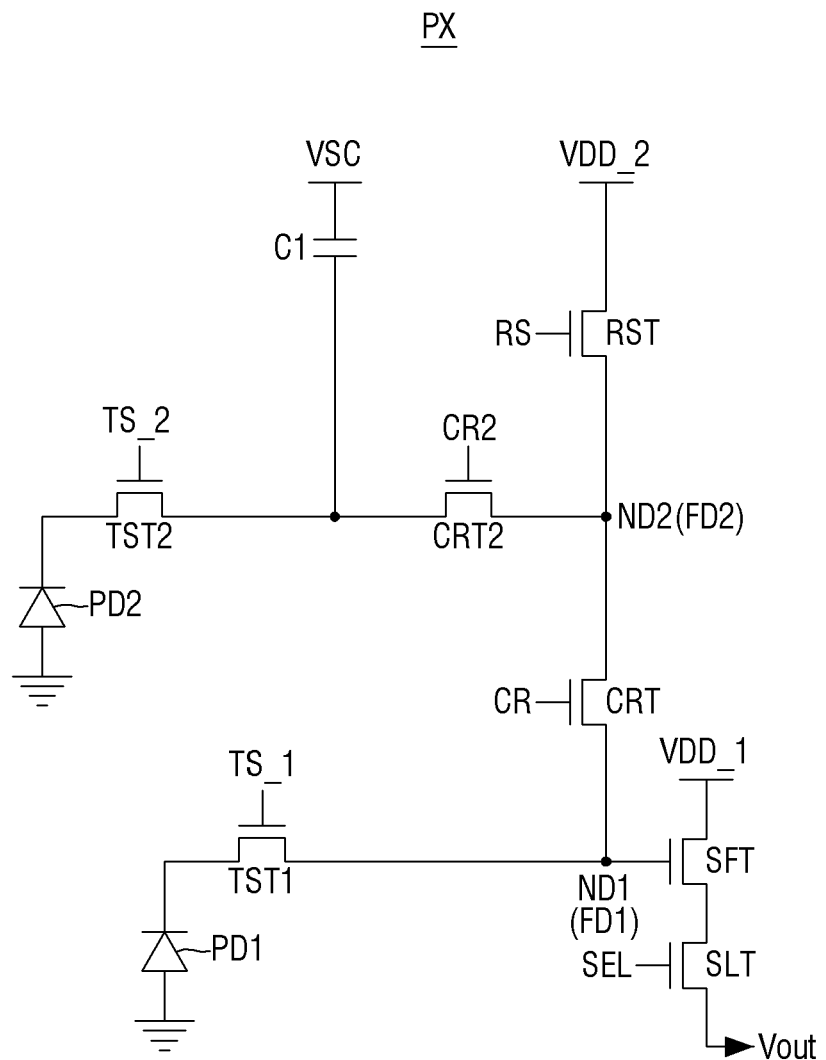
FIG. 27 is an exemplary circuit view illustrating one pixel according to another embodiment.
Figure 28:
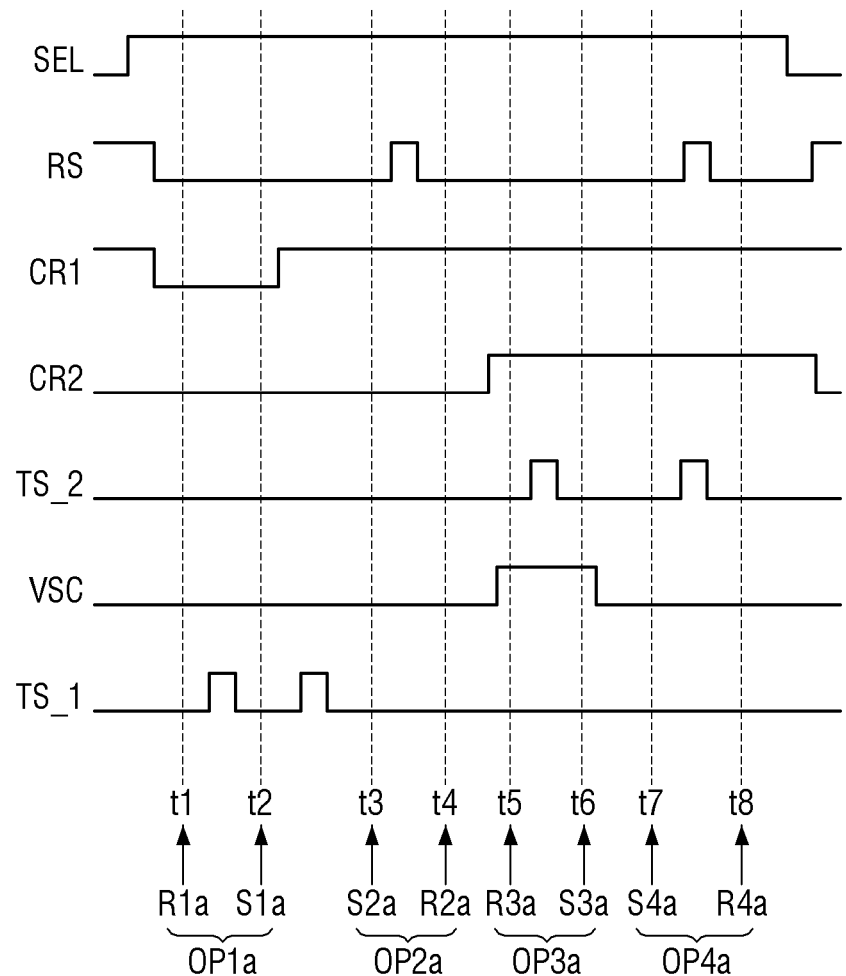
FIG. 28 is an exemplary timing view illustrating one pixel having the circuit structure of FIG. 27.

FIG. 27 is a circuit view illustrating one pixel according to another embodiment. FIG. 28 is an exemplary timing view illustrating one pixel having the circuit structure of FIG. 27.

According to the embodiment of FIGS. 27 and 28, even in the pixel that includes a plurality of subpixels, the first capacitor C1 may be connected to a capacitor voltage signal VSC not the third power voltage VDD_3, as in the embodiment of FIGS. 16 and 17.

Since the basic configuration and operation of the present embodiment are substantially the same as those of FIGS. 22 and 23, and the capacitor voltage signal VSC and the operation thereof are the same as those described with reference to FIGS. 16 and 17, their repeated description will be omitted.

Figure 29:
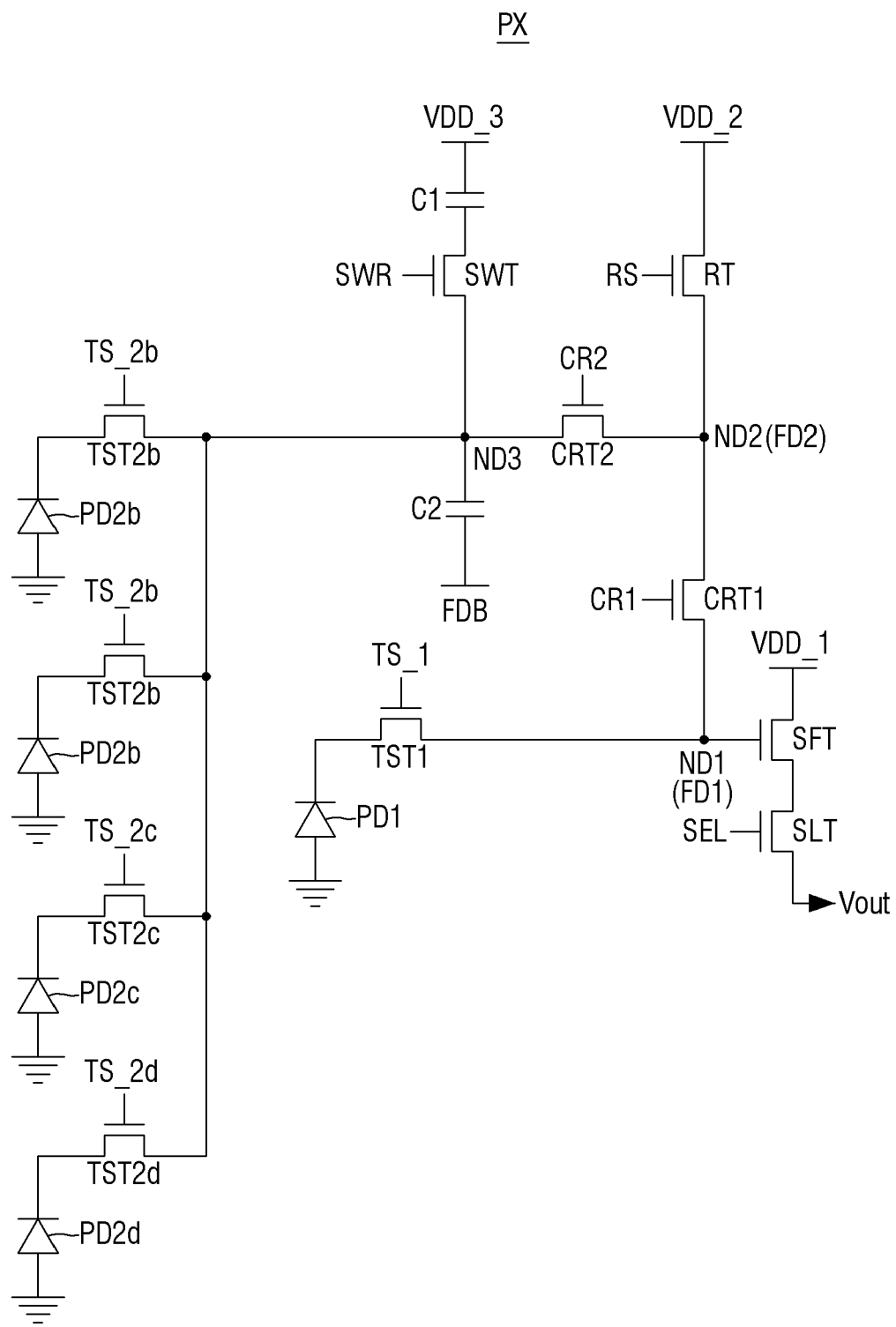
FIG. 29 is an exemplary circuit view illustrating one pixel according to another embodiment.

FIG. 29 is a circuit view illustrating one pixel according to another embodiment.

According to the embodiment of FIG. 29, even in a pixel that includes a plurality of subpixels, the second subpixel SPX may include a plurality of second sub-photodiodes PD2a, PD2b, PD2c and PD2d, and the second sub-transmission transistors TST2a, TST2b, TST2c and TST2d respectively connected to the second sub-photodiodes PD2a, PD2b, PD2c and PD2d may be all connected to the third node ND3, as in the embodiment of FIG. 18.

Since the basic configuration and operation of the present embodiment are substantially the same as those of FIGS. 22 and 23, and the plurality of second sub-photodiodes PD2a, PD2b, PD2c and PD2d, the second sub-transmission transistors TST2a, TST2b, TST2c and TST2d, and the second sub-transmission signals TS_2a, TS_2b, TS_2c and TS_2d applied to the second sub-transmission transistors are the same as those described with reference to FIGS. 16 and 17, their repeated description will be omitted.

Although not shown in the drawings, the embodiment of FIGS. 14 and 15 and the embodiment of FIG. 20 may be combined as a modified example of the second subpixel of the embodiment of FIGS. 22 and 23, and various combinations of other embodiments are possible.

Hereinafter, a vehicle including an image sensor according to some embodiments will be described with reference to FIG. 30.

Figure 30:
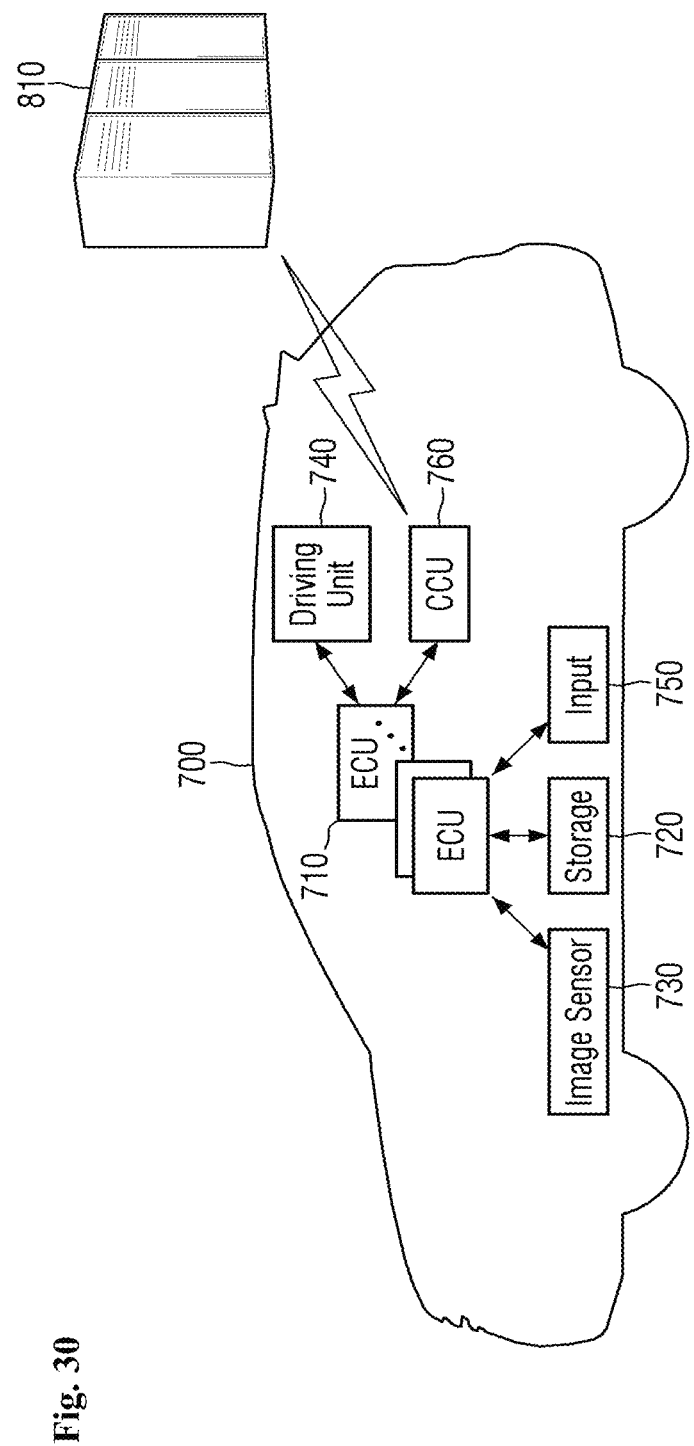
FIG. 30 is a view illustrating a vehicle including an image sensor according to some embodiments.

FIG. 30 is a view illustrating a vehicle including an image sensor according to some embodiments.

Referring to FIG. 30, the vehicle 700 may include a plurality of electronic control units (ECU) 710 and a storage unit 720.

Each of the plurality of electronic control units 710 is electrically, mechanically and communicatively connected to at least one of a plurality of devices provided in the vehicle 700 and may control an operation of at least one device based on any one function execution command.

In this case, the plurality of devices may include an image sensor 730 for acquiring an image required for execution of at least one function and a driving unit 740 for performing at least one function.

The image sensors according to the above-described various embodiments may be applied to the image sensor 730. The image sensor 730 may correspond to an automotive image sensor.

The driving unit 740 may include a fan and a compressor of an air conditioner, a fan of a ventilation device, an engine and a motor of a power device, a motor of a steering device, a motor and a valve of a braking device, a switching device of a door or a tail gate, and the like.

The plurality of electronic control units 710 may perform communication with the image sensor 730 and the driving unit 740 by using at least one of Ethernet, low voltage differential signal (LVDS) communication, or Local Interconnect Network (LIN) communication.

The plurality of electronic control units 710 may determine whether there is a need to execute a function based on information acquired through the image sensor 730, and when it is determined that execution of the function is required, may control the operation of the driving unit 740 for performing the corresponding function and control the operation amount based on the acquired information. At this time, the plurality of electronic control units 710 may store the acquired image in the storage unit 720 or read and use the information stored in the storage unit 720.

The plurality of electronic control units 710 may control the operation of the driving unit 740, which performs the corresponding function, based on the function execution command input through an input unit 750, and may check the amount of setup corresponding to the information input through the input unit 750 and control the operation of the driving unit 740, which performs the corresponding function, based on the checked amount of setup.

Each electronic control unit 710 may independently control any one function or may be associated with another electronic control device to control any one function.

For example, when a distance from an obstacle detected through a distance detector is within a reference distance, an electronic control unit of a collision avoidance system may output a warning sound for the collision with the obstacle through a speaker.

An electronic control unit of an autonomous driving control system may be associated with an electronic control unit of a vehicle terminal, an electronic control unit of an image acquisition unit, and the electronic control unit of the collision avoidance system to receive navigation information, road image information and distance information from the obstacle and control the power device, the braking device and the steering device by using the received information, thereby performing autonomous driving.

A connectivity control unit (CCU) 760 is electrically, mechanically, communicatively connected with each of the electronic control units 710 and performs communication with each of the electronic control units 710.

That is, the connectivity control unit 760 may directly perform communication with the electronic control units 710 provided inside the vehicle, may perform communication with an external server, and may perform communication with an external terminal through an interface.

The connectivity control unit 760 may perform communication with the electronic control units 710 and may perform communication with a server 810 through an antenna (not shown) and RF communication.

In addition, the connectivity control unit 760 may perform communication with the server 810 through wireless communication. In this case, the wireless communication between the connectivity control unit 760 and the server 810 is possible through various wireless communication modes such as Global System for Mobile Communication (GSM), Code Division Multiple Access (CDMA), Wideband Code Division Multiple Access (WCDMA), Universal Mobile Telecommunications System (UMTS), Time Division Multiple Access (TDMA) system and Long Term Evolution (LTE) system, in addition to a Wi-Fi module and a wireless broadband (WiBro) module.

The image sensor described above is a kind of an optical sensor, and the spirits according to the embodiments are applicable to other types of sensors for sensing the amount of light incident using a semiconductor, a fingerprint sensor, distance measuring sensors, etc., in addition to the image sensor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor comprising:
   a photodiode;
   a transmission transistor having a first end connected to the photodiode and a second end connected to a first node;
   a first switching transistor having a first end connected to the first node;
   a first capacitor having a first electrode connected to a second end of the first switching transistor; and
   a second capacitor having a first electrode connected to the first node,
   wherein a second electrode of the first capacitor is configured to receive a power voltage, and
   a second electrode of the second capacitor is configured to receive a boosting signal.

2. The image sensor as claimed in claim 1, wherein the boosting signal has a signal waveform that swings between a high boosting voltage level and a low boosting voltage level that is lower than the high boosting voltage level.

3. The image sensor as claimed in claim 2, wherein a potential of the first node increases when the boosting signal of the high boosting voltage level is applied to the second electrode of the second capacitor.

4. The image sensor as claimed in claim 3, wherein a potential difference between the photodiode and the first node when the boosting signal of the high boosting voltage level is applied is greater than a potential difference between the photodiode and the first node when the boosting signal of the low boosting voltage level is applied.

5. The image sensor as claimed in claim 2, wherein a gate of the transmission transistor is configured to receive a transmission signal, the transmission signal having a high transmission voltage level at least partially at a time period at which the boosting signal has the high boosting voltage level.

6. The image sensor as claimed in claim 1, further comprising a second switching transistor connected between the first node and the second capacitor,
   wherein the first switching transistor and the second switching transistor are configured to receive respective control signals that are different from each other.

7. The image sensor as claimed in claim 6, wherein the boosting signal is a reference voltage that does not swing.

8. The image sensor as claimed in claim 2, further comprising
   a source follower transistor having a gate connected to the first node,
   wherein the source follower transistor is configured to output charges provided from the photodiode in a state in which the transmission transistor is turned on and the first switching transistor is turned off while the boosting signal of the high boosting voltage level is being applied, and
   the source follower transistor is configured to output charges accumulated in the first capacitor in a state in which the first switching transistor is turned on and the transmission transistor is turned off while the boosting signal of the low boosting voltage level is being applied.

9. An image sensor comprising:
   a photodiode;
   a transmission transistor having a first end connected to the photodiode and a second end connected to a first node;
   a first capacitor having a first electrode connected to the first node and a second electrode connected to a capacitor voltage line applying a capacitor voltage signal, and
   a switching transistor connected between the first node and the first electrode of the first capacitor,
   wherein the capacitor voltage signal has a signal waveform that swings between a high voltage level and a low voltage level that is lower than the high voltage level.

10. The image sensor as claimed in claim 9, wherein a potential of the first node increases when the capacitor voltage signal of the high voltage level is applied to the second electrode of the first capacitor.

11. The image sensor as claimed in claim 9, further comprising
    a source follower transistor having a gate connected to the first node and a first end connected to a power line supplying a power voltage,
    wherein the source follower transistor is configured to turn on based on output charges provided from the photodiode in a state in which the transmission transistor is turned on while the capacitor voltage signal of the high voltage level is being applied to the second electrode of the first capacitor, and
    the source follower transistor is configured to turn on based on charges accumulated in the first capacitor in a state in which the transmission transistor is turned off while the capacitor voltage signal of the low voltage level is being applied to the second electrode of the first capacitor.

12. The image sensor as claimed in claim 11, wherein the high voltage level of the capacitor voltage signal is greater than the power voltage.

13. An image sensor comprising:
a first photodiode;
a second photodiode separated from the first photodiode;
a first transmission transistor having a first end connected to the first photodiode and a second end connected to a first node;
a first connection transistor having a first end connected to the first node and a second end connected to a second node;
a second connection transistor having a first end connected to the second node and a second end connected to a third node;
a second transmission transistor connected between the second photodiode and the third node;
a first switching transistor having a first end connected to the third node;
a first capacitor having a first electrode connected to a second end of the first switching transistor; and
a second capacitor having a first electrode connected to the first-third node,
wherein a second electrode of the first capacitor is configured to receive a power voltage, and
a second electrode of the second capacitor is configured to receive a boosting signal.

14. The image sensor as claimed in claim 13, wherein the boosting signal has a signal waveform that swings between a high boosting voltage level and a low boosting voltage level that is lower than the high boosting voltage level.

15. The image sensor as claimed in claim 14, wherein a potential of the third node increases when the boosting signal of the high boosting voltage level is applied to the second electrode of the second capacitor.

16. The image sensor as claimed in claim 15, wherein a potential difference between the second photodiode and the third node when the boosting signal of the high boosting voltage level is applied is greater than a potential difference between the second photodiode and the third node when the boosting signal of the low boosting voltage level is applied.

17. The image sensor as claimed in claim 14, wherein a gate of the first transmission transistor is configured to receive a first transmission signal, and a gate of the second transmission transistor is configured to receive a second transmission signal different from the first transmission signal, and
the second transmission signal has a high transmission voltage level at least partially at a time period at which the boosting signal has a high boosting voltage level.

18. The image sensor as claimed in claim 14, further comprising a source follower transistor having a gate connected to the first node,
wherein the source follower transistor is configured to output charges provided from the first photodiode in a state in which the first transmission transistor is turned on and the first switching transistor is turned off while the boosting signal of the high boosting voltage level is being applied, and
the source follower transistor is configured to output charges accumulated in the first capacitor in a state in which the first switching transistor is turned on and the first transmission transistor is turned off while the boosting signal of the low boosting voltage level is being applied.

19. The image sensor as claimed in claim 13, further comprising a second switching transistor connected between the third node and the second capacitor,
wherein the first switching transistor and the second switching transistor are configured to receive respective control signals that are different from each other, and
the boosting signal is a reference voltage that does not swing.

* * * * *